(12) United States Patent
Mitamura

(10) Patent No.: US 9,701,044 B2
(45) Date of Patent: *Jul. 11, 2017

(54) FINE CONCAVO-CONVEX STRUCTURE PRODUCT, HEAT-REACTIVE RESIST MATERIAL FOR DRY ETCHING, MOLD MANUFACTURING METHOD AND MOLD

(71) Applicant: ASAHI KASEI KABUSHIKI KAISHA, Tokyo (JP)

(72) Inventor: Yoshimichi Mitamura, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/656,012

(22) Filed: Mar. 12, 2015

(65) Prior Publication Data

US 2015/0183152 A1    Jul. 2, 2015

Related U.S. Application Data

(62) Division of application No. 14/374,686, filed as application No. PCT/JP2013/051432 on Jan. 24, 2013.

(30) Foreign Application Priority Data

| Jan. 27, 2012 | (JP) | 2012-014820 |
| Jun. 5, 2012 | (JP) | 2012-128275 |
| Aug. 24, 2012 | (JP) | 2012-185252 |

(51) Int. Cl.
*B29C 59/00* (2006.01)
*B29C 33/42* (2006.01)
(Continued)

(52) U.S. Cl.
CPC .......... *B29C 33/3842* (2013.01); *B29C 33/38* (2013.01); *B29C 33/42* (2013.01);
(Continued)

(58) Field of Classification Search
CPC ..... B29C 33/3842; B29C 33/38; B29C 33/42; B29C 59/002; G03F 7/04; G03F 7/0755;
(Continued)

(56) References Cited

U.S. PATENT DOCUMENTS

| 4,810,547 A * | 3/1989 | Minami | B29C 43/021 |
| | | | 264/106 |
| 2003/0175617 A1 * | 9/2003 | Kato | G03F 7/0046 |
| | | | 430/270.1 |

(Continued)

FOREIGN PATENT DOCUMENTS

| JP | 2003-315988 A | 11/2003 |
| JP | 2005-100602 A | 4/2005 |

(Continued)

OTHER PUBLICATIONS

International Preliminary Report on Patentability and English translation of Written Opinion issued Aug. 7, 2014, in PCT International Application No. PCT/JP2013/051432.

(Continued)

*Primary Examiner* — Nahida Sultana
(74) *Attorney, Agent, or Firm* — Birch, Stewart, Kolasch & Birch, LLP

(57) ABSTRACT

A fine concavo-convex structure product (10) is provided with an etching layer (11), and a resist layer (12) comprised of a heat-reactive resist material for dry etching provided on the etching layer (11), a concavo-convex structure associated with opening portions (12a) formed in the resist layer (12) is formed in the etching layer (11), a pattern pitch P of a fine pattern of the concavo-convex structure ranges from (Continued)

1 nm to 10 µm, a pattern depth H of the fine pattern ranges from 1 nm to 10 µm, and a pattern cross-sectional shape of the fine pattern is a trapezoid, a triangle or a mixed shape thereof. The heat-reactive resist material for dry etching has, as a principal constituent element, at least one species selected from the group consisting of Cu, Nb, Sn, Mn, oxides thereof, nitrides thereof and NiBi.

8 Claims, 7 Drawing Sheets

(51) Int. Cl.
| | |
|---|---|
| B29C 33/38 | (2006.01) |
| B81C 99/00 | (2010.01) |
| C09K 13/00 | (2006.01) |
| C23F 1/00 | (2006.01) |
| G03F 7/00 | (2006.01) |
| G03F 7/04 | (2006.01) |
| G03F 7/075 | (2006.01) |
| H01L 21/033 | (2006.01) |
| B29L 31/00 | (2006.01) |

(52) U.S. Cl.
CPC ........ *B29C 59/002* (2013.01); *B81C 99/0085* (2013.01); *C09K 13/00* (2013.01); *C23F 1/00* (2013.01); *G03F 7/0002* (2013.01); *G03F 7/04* (2013.01); *G03F 7/0755* (2013.01); *B29K 2905/06* (2013.01); *B29L 2031/757* (2013.01); *H01L 21/0337* (2013.01); *Y10T 428/24612* (2015.01)

(58) Field of Classification Search
CPC ......... G03F 7/0002; G11B 7/261; C23F 1/00; C09K 13/00; B81C 99/0085; B22C 7/00
See application file for complete search history.

(56) References Cited

U.S. PATENT DOCUMENTS

| | | | |
|---|---|---|---|
| 2004/0170916 A1 | 9/2004 | Kouchiyama et al. | |
| 2005/0045587 A1 | 3/2005 | Kawaguchi et al. | |
| 2007/0158872 A1* | 7/2007 | Jeong | B82Y 10/00 264/220 |
| 2007/0267764 A1 | 11/2007 | Morimoto | |
| 2008/0118697 A1* | 5/2008 | Takahashi | G11B 7/263 428/64.4 |
| 2009/0017266 A1* | 1/2009 | Deguchi | B82Y 10/00 428/187 |
| 2009/0200266 A1* | 8/2009 | Doyle | B82Y 10/00 216/60 |
| 2009/0243126 A1* | 10/2009 | Washiya | B29C 35/0888 264/2.5 |
| 2009/0311363 A1* | 12/2009 | Dobisz | B82Y 10/00 425/470 |
| 2010/0025366 A1* | 2/2010 | Furui | B82Y 10/00 216/41 |
| 2010/0034911 A1* | 2/2010 | Mori | G03F 7/0002 425/89 |
| 2010/0092727 A1* | 4/2010 | Uchida | B29C 33/40 428/142 |
| 2011/0195142 A1 | 8/2011 | Mitamura et al. | |
| 2012/0135353 A1 | 5/2012 | Amemiya et al. | |
| 2015/0044417 A1* | 2/2015 | Koike | B29C 59/022 428/137 |
| 2015/0301230 A1* | 10/2015 | Dai | B29C 33/38 359/601 |

FOREIGN PATENT DOCUMENTS

| | | |
|---|---|---|
| JP | 2007-144995 A | 6/2007 |
| JP | 2007-315988 A | 12/2007 |
| WO | WO 2010/044400 A1 | 4/2010 |
| WO | WO 2011/002060 A1 | 1/2011 |

OTHER PUBLICATIONS

Johokiko Co., LTD., "Latest Resist Materials," pp. 59-79, Sep. 2005, with an English translation.
Kostyukevych, "Investigations and Modelling of Physical Processes in Inorganic Resists for the use in UV and Laser Lithography," SPIE, vol. 3424, Jul. 1998, pp. 20-27.
Ohara., "Etching for Micro/Nano Fabrication," Chapter 3, published by CMC Publishing Co., LTD., pp. 159-169, Oct. 2009, with an English translation.
Wasa et al., "Sputter Technology," published by Kyoritsu Shuppan Co., LTD., Jun. 1988, pp. 15-18, with an English translation.

* cited by examiner

US 9,701,044 B2

FINE CONCAVO-CONVEX STRUCTURE PRODUCT, HEAT-REACTIVE RESIST MATERIAL FOR DRY ETCHING, MOLD MANUFACTURING METHOD AND MOLD

CROSS-REFERENCE TO RELATED APPLICATIONS

This application is a Divisional of co-pending application Ser. No. 14/374,686 filed on Jul. 25, 2014, which is a National Phase of PCT International Application No. PCT/JP2013/051432 filed on Jan. 24, 2013, which claims priority under 35 U.S.C. §119(a) to Patent Application No. 2012-014820 filed in Japan on Jan. 27, 2012, Patent Application No. 2012-128275 filed in Japan on Jun. 5, 2012, and Patent Application No. 2012-185252 filed in Japan on Aug. 24, 2012. All of the above applications are hereby expressly incorporated by reference into the present application.

TECHNICAL FIELD

The present invention relates to a fine concavo-convex structure product, heat-reactive resist material for dry etching, mold manufacturing method using the same and mold.

BACKGROUND ART

In recent years, in the fields of semiconductor, optical magnetic recording, etc., as demands for higher density, higher integration and others have increased, techniques have become essential for fine pattern processing of about several hundreds to tens of nanometers or less. Therefore, to achieve the fine pattern processing, elemental techniques of each process have been studied actively such as a mask•stepper, exposure, dry etching and resist material.

For example, in the process of mask•stepper are studied techniques for using a particular mask called the phase shift mask to provide light with a phase difference, and enhancing fine pattern processing accuracy by the effect of interference, liquid dip techniques for filling between a lens for a stepper and a wafer with liquid, largely refracting light passed through the lens, and thereby enabling fine pattern processing, etc. However, the former techniques require huge costs for mask development, the latter techniques require an expensive apparatus, and it is thus extremely difficult to reduce manufacturing costs.

On the other hand, many studies have proceeded also on resist materials, and currently, the most common resist material is a photoreactive organic resist (herein after, also referred to as a photoresist) that reacts by an exposure light source such as ultra violet light, electron beam and X-rays (for example, see Patent Document 1 and Non-patent Document 1).

FIG. 1 is a graph illustrating the relationship between a spot diameter of laser light and laser intensity. In FIG. 1, the horizontal axis represents the spot diameter (Rs) of laser light, and the vertical axis represents laser light intensity (E). In the laser light used in exposure, the intensity (E) of the laser light focused by the lens generally shows the Gaussian distribution with respect to the spot diameter (Rs) as shown in FIG. 1. At this point, the spot diameter (Rs) is defined by $1/e^2$. In general, in the reaction of a photoresist, the photoreaction starts by absorbing energy represented by $E=h\nu$ (E: energy, h: Planck constant, $\nu$: wavelength). Accordingly, the photoreaction is not dependent on the intensity of the light strongly, and is rather dependent on the wavelength of the light, and therefore, the photoreaction occurs in the entire area (hereafter, referred to as "exposed area") irradiated with the light. Therefore, when the photoresist is used, the area corresponding to the spot diameter (Rs) is the exposed area.

The method of using a photoresist is an extremely effective method in forming fine patterns of about hundreds of nanometers, and the photoreaction proceeds in the area corresponding to the spot diameter. Therefore, to form a finer pattern, it is necessary to expose with a smaller spot diameter than the pattern required in principle. Accordingly, it is indispensable to use a KrF laser, ArF laser or the like with short wavelengths as an exposure light source. However, these light source apparatuses are remarkably large-size and expensive, and are unsuitable from the viewpoint of reducing manufacturing costs. Further, in the case of using the exposure light source of electron beam, X-rays or the like, since it is necessary to evacuate the exposure atmosphere to a vacuum state, using a vacuum chamber is required, and there are significant limitations from the viewpoints of the cost and increases in the size.

On the other hand, when a substance is irradiated with the laser light showing the Gaussian distribution as shown in FIG. 1, the temperature of the substance also shows the same Gaussian distribution as the intensity distribution of the laser light. FIG. 2 is a graph illustrating the relationship between an exposed area of the laser light and temperature. In FIG. 2, the horizontal axis represents the exposed area (Ae), and the vertical axis represents the temperature (T). In this case, when a resist (herein after, referred to as "heat-reactive resist") that reacts at a predetermined temperature or more is used, as shown in FIG. 2, since the reaction proceeds only in the portion becoming the predetermined temperature (resist reaction temperature: Tr) or more, it is made possible to expose the area (Ae) smaller than the spot diameter (Rs). In other words, without shortening the wavelength of the exposure light source, it is possible to form the pattern finer than the spot diameter (Rs), and by using the heat-reactive resist, it is possible to reduce the effect of the wavelength of the exposure light source.

In the field of optical recording, proposed are techniques for using WOx, MoOx, chalcogenide glass (Ag—As—S system) or the like as the heat-reactive resist, and forming a fine pattern by exposing with a semiconductor laser or 476-nm laser (see Patent Document 2 and Non-patent Document 2). The optical disks used in the optical recording field are a general name for media such that laser is applied to the disk coated with the resist material to read information recorded on fine concavities and convexities provided on the disk surface. In the optical disk, as the interval of a recording unit called the track pitch is narrower, the recording density increases, and the data capacity recordable for each area increases. Therefore, in order to increase the recording density, researches are performed on fine concavo-convex pattern processing techniques using resist materials.

However, the researches using the heat-reactive resist materials respond to requirements for narrowing (increasing the recording density of information) the pitch of the pattern in the film surface direction, and there has been no requirement for forming a deep groove in the film thickness direction. On the other hand, in recent years, in many fields, there have been increasing requirements for application using a pattern shape having a deep groove in the film thickness direction. As the depth of the groove in the film thickness direction, the thickness of the film of the heat-reactive resist is the depth of the groove in the film thickness direction without modification, and to form a groove deeply, it is necessary to thicken the heat-reactive resist. However, in the heat-reactive resist, by thickening the film thickness, uniformity of the thermal reaction by exposure is lost in the film thickness direction. As a result, there are problems that it is difficult to form a deep groove in the film thickness direction, and that processing accuracy of a fine pattern also degrades in the film surface diction.

Then, such a method is also conceivable that a film (herein after, referred to as "etching layer") with a thickness corresponding to a desired groove depth is beforehand formed under the heat-reactive resist. In this case, the heat-reactive resist provided with a pattern shape by exposure•development is used as a mask. Then, by etching the etching layer using the mask, a deep groove is formed. Generally, dry etching is used to etch uniformly in the film thickness direction. For example, when $SiO_2$ is used in the etching layer, it is possible to perform dry etching using a fluorine-containing gas. In the case of processing by dry etching, the heat-reactive resist used as a mask is required to have resistance to dry etching using a fluorine-containing gas as well as permitting the fine pattern processing.

On the other hand, also in dry etching techniques, since a wide variety of etching shapes is required corresponding to applications, many studies are implemented such as a study for improving an electrode structure and the like of a dry etching apparatus and a study for controlling gas species for etching to use. For example, as techniques for deepening a groove depth of a pattern, there is the Bosch method developed by Bosch Corporation. In the Bosch method is reported the technique for switching the atmosphere inside a process chamber between an etching gas (for example, $CF_4$ gas and $SF_6$ gas) and a side wall protection gas (for example, gas with F/C of 3 or less such as $C_4F_8$ gas) and thereby forming a deep groove in the film thickness direction using photoresists (see Non-patent Document 3). Further, in dry etching using the side wall protection gas, a protective film of fluorocarbon is formed on the side wall of the etching layer formed by dry etching. The technique is further reported together with the photoresists in which by using this protective film, the dry etching rate in the film thickness direction and the dry etching rate in the film surface direction are changed to attain a desired etching angle (taper angle).

Previously, with respect to dry etching resistance of inorganic-based heat-reactive resist materials, the inventor of the present invention found out that elements such that the boiling point of the fluoride is 200° C. or more has high dry etching resistance (see Patent Document 3).

PRIOR ART DOCUMENT

Patent Document

[Patent Document 1]Japanese Unexamined Patent Publication No. 2007-144995
[Patent Document 2]Japanese Unexamined Patent Publication No. 2007-315988
[Patent Document 3]International Publication No. 2010/044400 Pamphlet Non-patent Document

[Non-patent Document 1]"Latest Resist Materials" published by Johokiko Co., Ltd. P. 59-P. 76
[Non-patent Document 2]SPIE Vol. 3424 (1998) P. 20
[Non-patent Document 3]"Etching technology of micro•nano device" published by CMC Publishing Co., Ltd. P. 159-169

DISCLOSURE OF INVENTION

Problems to be Solved by the Invention

In addition, in the above-mentioned Bosch method, by repeating dry etching of the etching layer in the film thickness direction using the etching gas, and formation of the protective film of the etching layer in the film surface direction using the side wall protection gas, a deep groove is formed in the film surface direction in the etching layer. Therefore, in the case of performing dry etching using the heat-reactive resist layer provided on the etching layer as a mask, in addition to drying etching resistance to the etching gas, the heat-reactive resist layer is required to have high dry etching resistance also to the side wall protection gas.

However, in the conventional heat-reactive resist materials, there is knowledge of elements high in dry etching resistance to the etching gas, but there is no knowledge of elements high in dry etching resistance to the side wall protection gas. Therefore, in performing dry etching using the conventional heat-reactive resist material as a mask, there are the case where the heat-reactive resist is dry-etched by the side wall protection gas and it is not possible to always form a deep groove sufficiently in the film thickness direction, and the case where it is not possible to control a desired etching angle (taper angle).

The present invention was made in view of such a respect, and it is an object of the invention to provide a fine concavo-convex structure product having a fine pattern suitable for application to many fields, heat-reactive resist material for dry etching suitable for manufacturing of the fine concavo-convex structure product, mold manufacturing method using the same and mold.

Means for Solving the Problem

A fine concavo-convex structure product of the present invention is characterized by being provided with an etching layer, and a resist layer comprised of a heat-reactive resist material for dry etching provided on the etching layer, where a concavo-convex structure associated with opening portions formed in the resist layer is formed in the etching layer, a pattern pitch P of a fine pattern of the concavo-convex structure ranges from 1 nm to 10 μm, a pattern depth H of the fine pattern ranges from 1 nm to 10 μm, and a pattern cross-sectional shape of the fine pattern is a trapezoid, a triangle or a mixed shape thereof.

A heat-reactive resist material for dry etching according to the present invention is a heat-reactive resist material for dry etching to form the fine concavo-convex structure product as described above using a fluorine-containing gas such that a ratio (F/C) of the number of fluorine atoms to the number of carbon atoms is 3 or less, or 2.7 or less, and is characterized in that a principal constituent element is at least one species selected from the group consisting of Cr, Fe, Co, Al, Ga, In, Hf, Pb, oxides thereof and nitrides thereof.

A mold manufacturing method of the present invention is characterized by having the steps of providing a resist layer containing the heat-reactive resist material for dry etching of the invention as described above on a substrate to be the etching layer, exposing the resist layer, then developing, and forming a mask, performing dry etching via the mask, and removing the resist layer to manufacture a mold.

A mold of the present invention is characterized by being manufactured by the mold manufacturing method of the invention as described above.

Advantageous Effect of the Invention

According to the present invention, since in the concave-convex pattern, the pattern pitch P of the fine pattern of the concavo-convex structure ranges from 1 nm to 10 µm, the pattern depth H of the fine pattern ranges from 1 nm to 10 µm, and the pattern cross-section shape of the fine pattern is a trapezoid, triangle or mixed shape thereof, it is possible to design fine patterns freely so as to be suitable for application to substrates with fine concavities and convexities.

BEST MODE FOR CARRYING OUT THE INVENTION

Figure 1:
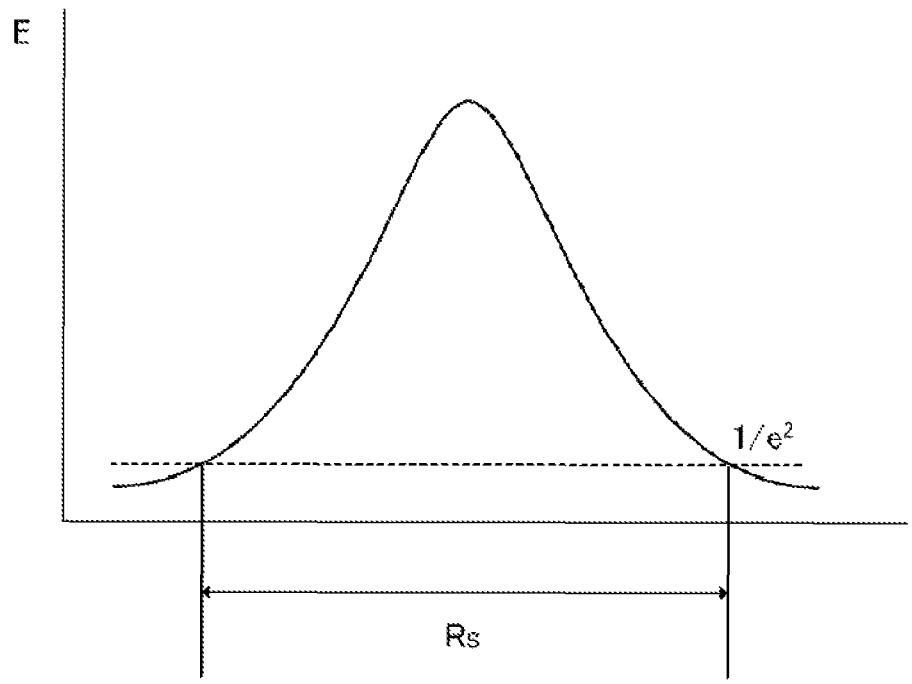
FIG. 1 is a graph illustrating the relationship between a spot diameter of laser light and laser intensity.
Figure 2:
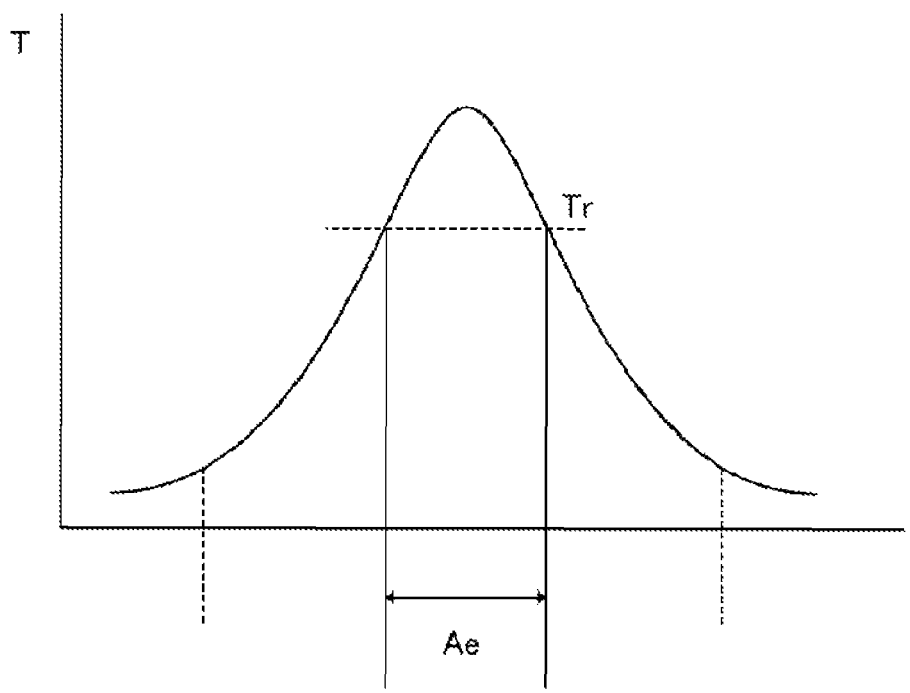
FIG. 2 is a graph illustrating the relationship between an exposed area of the laser light and temperature.

An Embodiment (herein after, abbreviated as "Embodiment") of the present invention will specifically be described below with reference to accompanying drawings. In addition, the present invention is not limited to the following Embodiment, and is capable of being carried into practice with various modifications thereof within the scope of the subject matter.

Conventionally, applications of a substrate (herein after, referred to as "substrate with fine concavities and convexities") provided with a concavo-convex structure having a fine pattern have been studied in many fields. In recent years, applications have increased of the substrate with fine concavities and convexities having a fine structure with a deep depth of a concave portion of the concavo-convex structure of the fine pattern. Among the applications, with consideration given to developments to substrates for antireflection, light condensing, light extraction, water repellency, hydrophilicity, media and film growth and the like, the inventor of the present invention found out that it is extremely important to freely design a depth so that the pattern depth ranges from about 1 nm to 10 µm in which a pattern pitch ranges from about 1 nm to 10 µm and is thus fine, and further, to design a fine pattern with a taper angle i.e. inclination in the depth direction of the pattern.

Conventionally, as a method of manufacturing the substrate with fine concavities and convexities, it is general to prepare a mold provided with a concavo-convex structure having a fine pattern, coat the surface of the mold with a resin to fill the concavo-convex structure with the resin, and transfer a resin layer thereby provided with the concavo-convex structure onto a substrate.

As techniques for forming a pattern in a mold substrate, first, there is machining. In this technique, by controlling a cutting blade, it is possible to freely design the pattern depth and taper angle. However, since the pattern pitch is dependent on the size of the cutting blade, it has been difficult to make the maximum pattern pitch 10 µm or less.

As another technique for forming a pattern, there is a method using a photoresist. According to this technique, it is possible to form a fine pattern with a pattern pitch of the order of nanometers. However, as described above, in the photoresist, since the width of fining is determined corresponding to the wavelength of light, it is necessary to make the light-source wavelength fine to form a concavo-convex structure with a pattern pitch of the order of nanometers, and the apparatus cost significantly increases, being not economic. Further, in a dry etching step for pattern formation, photoresists are poorer in dry etching resistance than heat-reactive resists, and it is thereby relatively difficult to form a fine pattern with a deep groove depth.

Then, in view of the above-mentioned issue, the inventor of the invention earnestly studied and developed heat-reactive resist materials for dry etching and etching materials which enable a fine pattern shape to be designed where the pattern pitch of the concavo-convex structure ranges from 1 nm to 10 µm, the pattern depth ranges from 1 nm to 10 µm, and an etching angle (taper angle) is provided in the pattern depth direction. Then, by using these resist materials and etching materials, it was possible to actualize molds having fine patterns suitable for various applications.

In other words, a fine concavo-convex structure product according to the present invention is characterized by being provided with an etching layer, and a resist layer comprised of a heat-reactive resist material for dry etching provided on a surface of the etching layer, where a fine pattern associated with opening portions formed in the resist layer is formed in the etching layer, a pitch (herein after, referred to as pattern pitch P) of a concavo-convex structure forming the fine pattern ranges from 1 nm to 10 µm, a depth (herein after, referred to as pattern depth H) of the concavo-convex structure forming the fine pattern ranges from 1 nm to 10 µm, and a cross-sectional shape (herein after, referred to as pattern cross-sectional shape) of the concavo-convex structure forming the fine pattern is a trapezoid, triangle or mixed shape thereof.

Herein, the pattern pitch P is a distance between adjacent convex portions or concave portions in a plurality of convex portions and concave portions forming the concavo-convex structure.

Further, the pattern depth H is a difference ΔH between a highest point ($H_1$) and a deepest point ($H_2$) of any one among a plurality of convex portions and concave portions forming the concavo-convex structure.

According to the fine concavo-convex structure product according to this Embodiment, it is possible to design fine patterns freely to be suitable for applications of the substrate with fine concavities and convexities.

As applications of the substrate with fine concavities and convexities, for example, there are substrates for antireflection, light condensing, light extraction, water repellency, hydrophilicity, media and film growth and the like. For antireflection, light condensing, light extraction and the like, it is possible to optimize the pattern pitch P, pattern depth H and pattern cross-sectional shape as appropriate corresponding to the wavelength of light to apply. Particularly, since efficiency of these items is increased when the pattern shape has a taper angle, the substrate with fine concavities and convexities according to this Embodiment is optimal. In addition, since it is conceivable to use as a film for the applications, it is also possible to use the substrate with fine concavities and convexities according to this Embodiment as a mold and transfer the fine concavities and convexities to a film. Further, for applications requiring water repellency and hydrophilicity, optimal water repellency and hydrophilicity is obtained, by optimizing the pattern pitch P, pattern depth H and pattern cross-sectional shape as appropriate. In addition, since a fluorocarbon film is attached to the side surface of the substrate with fine concavities and convexities according to this Embodiment, it is preferable to use for water repellent applications. Next, for media applications, it is possible to use as a substrate (template) in culturing cells in the fields of regenerative medicine and the like. Since cells grow in a three-dimensional manner, it is important to optimize the pattern pitch P, pattern depth H and pattern cross-sectional shape as appropriate. In addition, in peeling off cultured cells from the substrate, the shape easy to peel off is required. Among the shapes, the substrate with fine concavities and convexities according to this Embodiment having a taper angle is the most suitable for the culture field.

Further, a heat-reactive resist material for dry etching according to this Embodiment is used in the fine concavo-convex structure product according to the above-mentioned Embodiment, is a heat-reactive resist material for dry etching using a fluorine-containing gas such that a ratio (hereinafter, referred to as F/C) of the number of fluorine atoms to the number of carbon atoms is 3 or less, and is characterized in that a principal constituent element is at least one species selected from the group consisting of Cr, Fe, Co, Al, Ga, In, Hf, Pb, oxides thereof and nitrides thereof.

According to this configuration, since the boiling point of the primary fluoride is 200° C. or more in dry etching, it is possible to reduce dry etching by a chemical phenomenon that the constituent elements are fluorinated and removed. Further, since it is possible to decrease sputtering by a fluorine-containing gas with F/C of 3 or less or F/C of 2.7 or less, it is possible to reduce dry etching by a physical phenomenon that the constituent elements are removed by sputtering. By using the heat-reactive resist material for dry etching and etching material according to this Embodiment, it is possible to form the fine pattern as described above on the fine concavo-convex structure product according to this Embodiment. In other words, it is possible to design the pattern shape in which the pattern pitch P ranges from 1 nm to 10 μm, the pattern depth H ranges from 1 nm to 10 μm, and an etching angle (taper angle) is provided in the depth direction in the concave portion forming the concavo-convex structure.

In the heat-reactive resist material for dry etching and etching material according to this Embodiment, the boiling point of the fluoride of the principal element used in the heat-reactive resist material for dry etching is preferably 200° C. or more, and the boiling point of the fluoride of the principal element used in the etching material is preferably 200° C. or less. By selecting the heat-reactive resist material for dry etching and etching material from the viewpoint of the boiling point of the fluoride, it is possible to perform pattern design with ease.

Further, a manufacturing method of a mold according to this Embodiment is characterized by being provided with the steps of providing a resist layer containing the heat-reactive resist material for dry etching according to this Embodiment as described above on a substrate, exposing the resist layer, then developing, and forming a mask, performing dry etching on the substrate via the mask, and removing the resist layer to obtain a mold.

In the manufacturing method of a mold according to this Embodiment, it is preferable to use a fluorine-containing gas with F/C of 3 or less, or F/C of 2.7 or less.

A mold according to this Embodiment is characterized by being manufactured by the manufacturing method of a mold according to this Embodiment as described above.

Further, the mold according to this Embodiment is characterized by being obtained by removing the resist layer from the fine concavo-convex structure product.

The Embodiment of the present invention will specifically be described below.

[Fine Concavo-convex Structure Product]

The fine concavo-convex structure product according to this Embodiment is obtained by providing a resist layer comprised of the heat-reactive resist material for dry etching on an etching layer comprised of the etching material, exposing and developing the resist layer, forming masks with desired opening portions formed in the resist layer, and dry-etching the etching layer via masks. The masks are designed to be associated with a fine pattern as described below.

A mold is obtained by removing the resist from the fine concavo-convex structure product. It is possible to obtain the substrate with fine concavities and convexities by coating the surface of the obtained mold with a resin to fill the concavo-convex structure with the resin, and transferring the resin layer thus provided with the concavo-convex structure onto the substrate.

[Pattern Pitch P]

In the fine concavo-convex structure product according to this Embodiment, the pattern pitch P is a distance between adjacent convex portions among a plurality of convex portions forming the concavo-convex structure having a fine pattern. In addition, the pattern pitch P herein is not always the distance between adjacent convex portions of the concavo-convex structure, and may be the distance between adjacent concave portions.

The pattern pitch P1 ranges from 1 nm to 10 μm, more preferably ranges from 1 nm to 5 μm, further preferably ranges from 1 nm to 1 μm, and most preferably ranges from 10 nm to 950 μm. By setting the pattern pitch P within these ranges, for application with the need of a fine pattern, the heat-reactive resist material for dry etching and etching material according to this Embodiment enable the fine pattern to be formed efficiently and inexpensively in manufacturing. In addition, usually, as the pattern pitch P is smaller, preparation is difficult or increases in the cost are indispensable in the general method, but by using the heat-reactive resist material for dry etching and etching material according to this Embodiment, it is possible to form a fine pattern inexpensively in manufacturing.

[Pattern Depth H]

In the fine concavo-convex structure product according to this Embodiment, for example, it is possible to define the pattern depth H as a difference ΔH between a highest point ($H_1$) and a lowest point ($H_2$) of any one among a plurality of concave portions forming the concavo-convex structure.

Figure 3A:
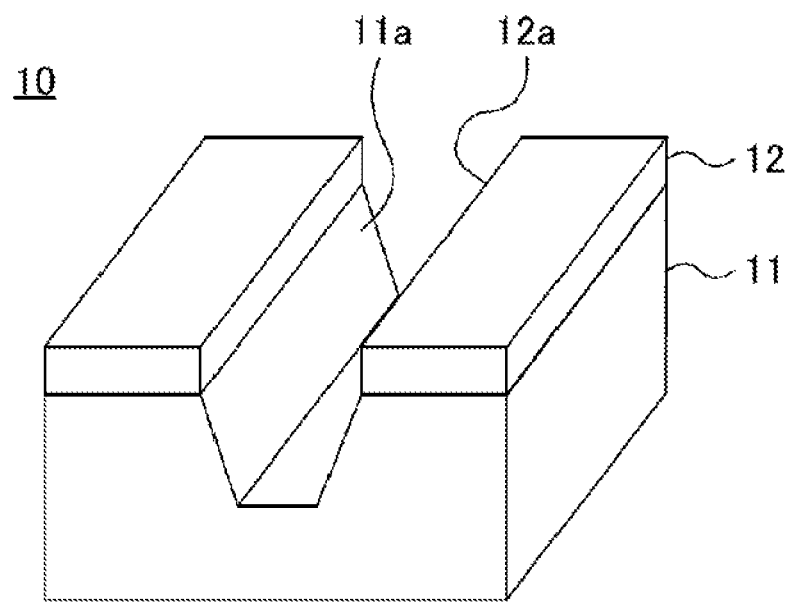
FIGS. 3A and 3B contain a perspective schematic diagram and cross-sectional schematic diagram illustrating a fine concavo-convex structure product according to this Embodiment.
Figure 3B:
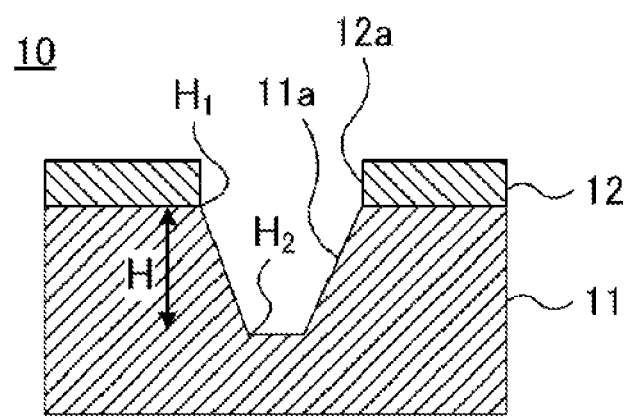

First, the pattern depth H will be described, using the case where the surface shape of the concave portion is line and space and the cross-sectional shape is a trapezoid, as an example. FIG. 3 contains a perspective schematic diagram and cross-sectional schematic diagram illustrating a fine concavo-convex structure product according to this Embodiment. As shown in the perspective schematic diagram of FIG. 3A, in a fine concavo-convex structure product 10, a resist layer 12 is provided on the surface of a substantially plate-shaped etching layer 11. In the resist layer 12 is formed an opening portion 12a in the shape of line and space. Then, in association with the opening portion 12a, a concave portion 11a of trapezoidal cross section is formed in the etching layer 11. As shown in the cross-sectional diagram of FIG. 3B, in the cross-sectional shape of the concave portion 11a, a difference ΔH between a highest point $H_1$ and a deepest point $H_2$ of the etching layer 11 is defined as the pattern depth H.

Figure 4A:
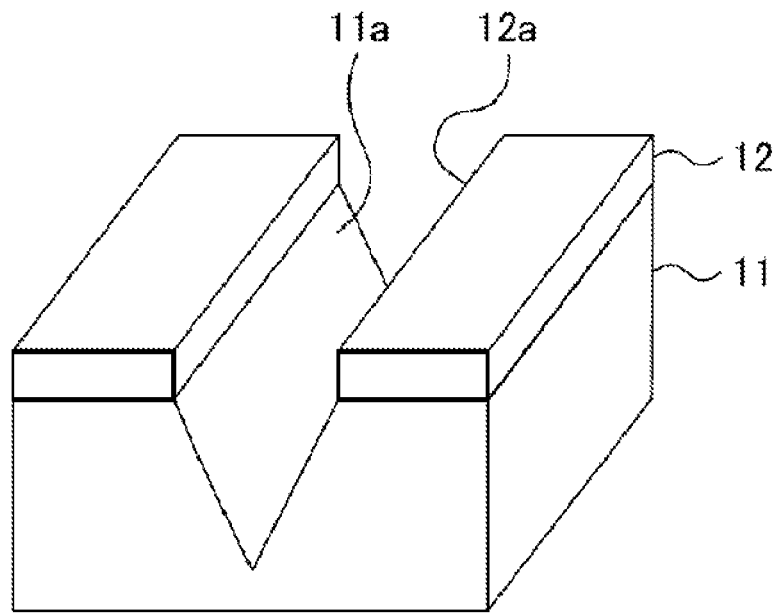
FIGS. 4A and 4B contain a perspective schematic diagram and cross-sectional schematic diagram illustrating another fine concavo-convex structure product according to this Embodiment.
Figure 4B:
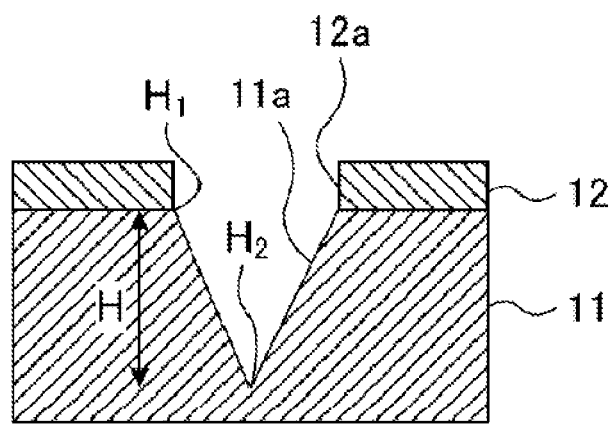

Next, the pattern depth H will be described, using the case where the surface shape of the concave portion is line and space and the cross-sectional shape is a triangle, as an example. FIG. 4 contains a perspective schematic diagram and cross-sectional schematic diagram illustrating a fine concavo-convex structure product according to this Embodiment. As shown in the perspective schematic diagram of FIG. 4A, in the resist layer 12 is formed an opening portion 12a in the shape of line and space. Then, in association with the opening portion 12a, a concave portion 11a of triangular cross section is formed in the etching layer 11. As shown in the cross-sectional diagram of FIG. 4B, in the cross-sectional shape of the concave portion 11a, a difference ΔH between a highest point $H_1$ and a deepest point $H_2$ of the etching layer 11 is defined as the pattern depth H.

Figure 5A:
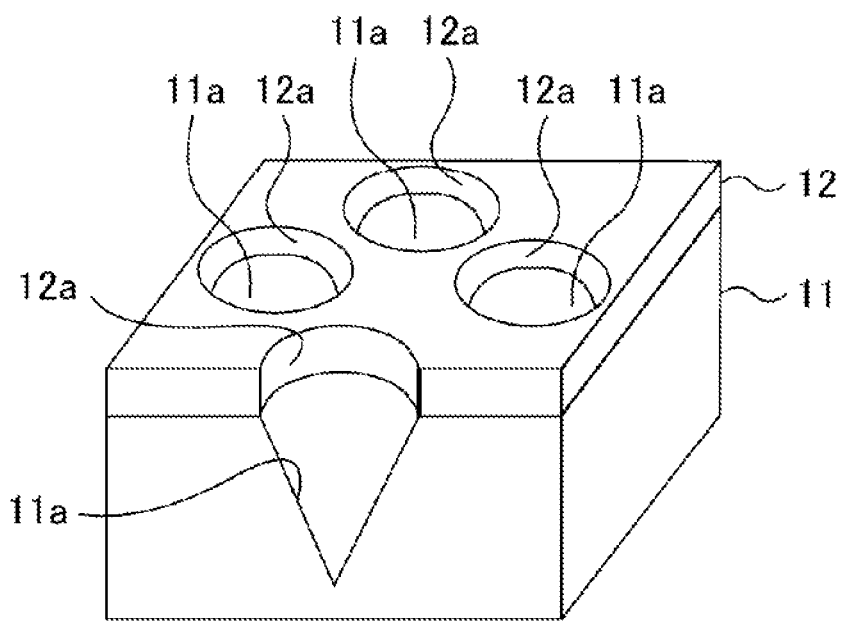
FIGS. 5A and 5B contain a perspective schematic diagram and cross-sectional schematic diagram illustrating still another fine concavo-convex structure product according to this Embodiment.
Figure 5B:
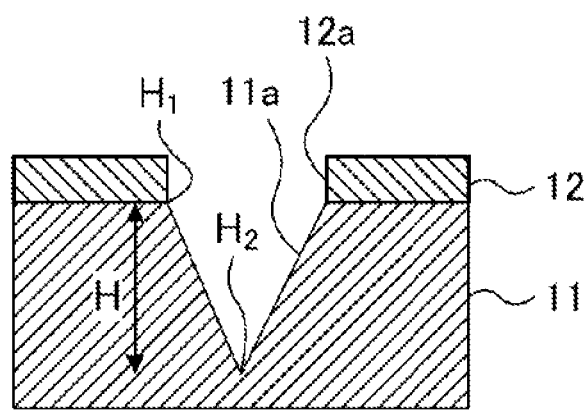

Next, the pattern depth H will be described, using the case where the surface shape of the concave portion is dots and the cross-sectional shape is a triangle, as an example. FIG. 5 contains a perspective schematic diagram and cross-sectional schematic diagram illustrating a fine concavo-convex structure product according to this Embodiment. As shown in the perspective schematic diagram of FIG. 5A, in the resist layer 12 are formed a plurality of opening portions 12a in the shape of dots. Then, in association with a plurality of opening portions 12a, a plurality of concave portions 11a of triangular cross section is formed in the etching layer 11. As shown in the cross-sectional diagram of FIG. 5B, in the cross-sectional shape of the concave portion 11a, a difference ΔH between a highest point $H_1$ and a deepest point $H_2$ of the etching layer 11 is defined as the pattern depth H.

The pattern depth H preferably ranges from 1 nm to 10 μm. In addition, it is possible to select the pattern depth H corresponding to application with the need of a fine pattern, it is usually possible to use when a value (aspect ratio) obtained by dividing the pattern depth H by the pattern pitch P is in the range of 0.1 to 100, the range of 0.2 to 10 is preferable, and the range of 0.3 to 5 is more preferable. By setting the pattern depth H within the ranges, for application with the need of a fine pattern, the heat-reactive resist material for dry etching and etching material of the present invention enable the pattern to be formed efficiently and inexpensively in manufacturing. Usually, as the pattern pitch P is smaller, it is difficult to form the pattern depth H deeply, but by using heat-reactive resist material for dry etching and etching material according to the invention, it is possible to form the pattern depth H within the above-mentioned range inexpensively in manufacturing.

[Pattern Cross-sectional Shape]

As the cross section of the pattern cross-sectional shape, for example, as the line and space shape, in one concave portion, when boundaries (i.e. edges) between the opening portion of the concave portion and the surface on the upper side (resist layer side) of the etching layer are two lines and the two lines do not cross each other, one point on one of the two lines and one point on the other one having the shortest distance there between are made two highest points, and the cross section of the pattern cross-sectional shape is the cross section obtained by cutting the fine concavo-convex structure product along the thickness direction of the etching layer so as to include these two highest points. In the cross section, the pattern cross-sectional shape is the shape drawn by connecting, with straight lines, the two highest points and one point when the lowest point of the concave portion is the one point, or two points having the longest distance when lowest points of the concave portion are two or more.

Further, as the cross section of the pattern cross-sectional shape, for example, as the hole shape, when the boundary (i.e. edge) between the opening portion of the concave portion and the surface on the upper side (resist layer side) of the etching layer is one line and both ends are connected and closed, two points on the one line having the longest distance there between are made two highest points, and the cross section of the pattern cross-sectional shape is the cross section obtained by cutting the fine concavo-convex structure product along the thickness direction of the etching layer so as to include these two highest points. In the cross section, the pattern cross-sectional shape is the shape drawn by connecting, with straight lines, the two highest points and one point when the lowest point of the concave portion is the one point, or two points having the longest distance when lowest points of the concave portion are two or more.

In any one of a plurality of convex portions forming the concavo-convex structure, the pattern cross-sectional shape is the shape drawn by connecting, with straight lines, one highest point or two highest points and two lowest points having the longest distance among lowest points of the convex portion, in the cross section obtained by cutting the fine concavo-convex structure product along the thickness direction of the etching layer, so as to include the one highest point when the highest point of the convex portion is the one point, or include the two highest points that are two points on one line and that have the longest distance when the highest points of the convex portion are two or more in the case where the boundary between the surface on the upper side and the side wall surface of the etching layer is the one line and both ends are connected and closed.

In the fine concavo-convex structure according to this Embodiment, the pattern cross-sectional shape is the shape of the cross section of any one of a plurality of concave portions formed in the etching layer of the fine concavo-convex structure product. The pattern cross-sectional shape is characterized by being a trapezoid, triangle or mixed shape thereof. It is possible to select the cross-sectional shape corresponding to application of the substrate with fine concavities and convexities.

In addition, the surface shape of the concavo-convex structure is not limited particularly, examples thereof are the line and space shape, dot shape (hole shape), and long-hole shape, and these shapes may coexist.

In the fine concavo-convex structure product according to this Embodiment, the pattern cross-sectional shape is characterized by meeting Equation (1) or Equation (2).

$$0 < T_0 = B_1 < T_1 \leq 10 \; \mu m \qquad \text{Eq. (1)}$$

$$0 \leq B_1 < T_0 = T_1 < 10 \text{ μm} \qquad \text{Eq. (2)}$$

Figure 6A:
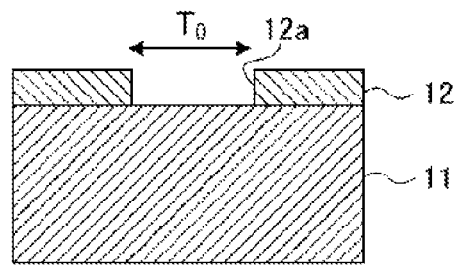
FIGS. 6A, 6B, 6C, and 6D contain cross-sectional schematic diagrams illustrating a concave portion of the fine concavo-convex structure product according to this Embodiment.

$T_0$: Width of the opening portion of the resist layer before dry etching $T_1$: Width of the concave portion on the highest portion side formed in the etching layer after dry etching $B_1$: Width of the concave portion on the deepest portion side formed in the etching layer after dry etching Above-mentioned Equations (1) and (2) will be described using FIG. 6. FIG. 6 contains cross-sectional schematic diagrams illustrating a concave portion of the fine concavo-convex structure product according to this Embodiment. FIG. 6A illustrates a layered structure product comprised of the etching layer and the resist layer before dry etching. A part of the resist layer 12 is removed, and the opening portion 12a is formed. The width of the opening portion 12a is defined as $T_0$.

Figure 6B:
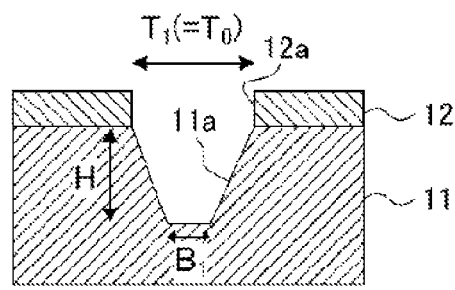

FIG. 6B is a cross-sectional schematic diagram illustrating the concave portion of the fine concavo-convex structure product after dry etching, and shows the case where the pattern cross-sectional shape is a trapezoid. The width of the concave portion 11a on the highest portion (opening portion) side formed in the etching layer 11 is defined as $T_1$, and the width on the deepest portion (bottom) side is defined as $B_1$. In this Example, $T_1$ and $T_0$ are equal. In other words, Equation (2) is met.

Figure 6C:
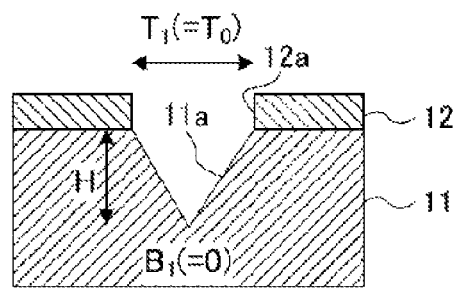

FIG. 6C is a cross-sectional schematic diagram illustrating the concave portion of the fine concavo-convex structure product after dry etching, and shows the case where the pattern cross-sectional shape is a triangle. This case shows $B_1=0$ i.e. a state in which the deepest portion is pointed. In this Example, $T_1$ and $T_0$ are equal. In other words, Equation (2) is met.

Figure 6D:
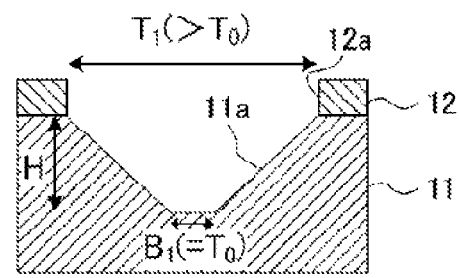

FIG. 6D is a cross-sectional schematic diagram illustrating the concave portion of the fine concavo-convex structure product after dry etching, and shows the case where the pattern cross-sectional shape is a trapezoid. In this case, $T_1$ is larger than $T_0$, and $B_1$ and $T_0$ are equal. In other words, Equation (1) is met.

[Manufacturing Method of Fine Concavo-convex Structure Product]

A manufacturing method of the fine concavo-convex structure product according to this Embodiment will be described.

Herein, in the case of forming a fine pattern using dry etching, two methods are broadly conceivable. In other words, there are a method (A) of etching only the etching layer without etching the resist layer functioning as a mask, and another method (B) of etching the resist layer functioning as a mask, and etching the etching layer in parallel. The pattern cross-sectional shape in the case of forming a fine pattern using the method (A) is expressed by Equation (2), and the pattern cross-sectional shape in the case of forming a fine pattern using the method (B) is expressed by Equation (1).

As shown in FIGS. 6B and 6C, in the pattern cross-sectional shape formed using the method (A), it is understood that there is the relationship that the width $T_0$ of the opening portion 12a of the resist layer 12 before dry etching is equal to the width $T_1$ on the highest portion side of the concave portion 11a, and that the resist layer 12 is not etched in dry etching. In this case, the pattern depth H is determined corresponding to the etching depth. Further, the etching angle (taper angle) is determined corresponding to dry etching. The width $B_1$ on the bottom side of the concave portion in the pattern cross-sectional shape is determined depending on the pattern depth H and etching angle. $B_1$ is capable of taking values of 0 or more and less than $T_0$. Thus, the pattern cross-sectional shape formed using the method (A) is expressed by Equation (2).

On the other hand, as shown in FIG. 6D, in the pattern cross-sectional shape formed using the method (B), it is understood that there is the relationship that the width $T_1$ on the highest portion side of the concave portion 11a is larger ($T_1 > T_0$) than the width $T_0$ of the opening portion 12a of the resist layer 12 before dry etching, the resist layer 12 is etched in dry etching and that the opening portion 12a is enlarged. In this case, in the pattern cross-sectional shape, the pattern depth H is determined corresponding to the etching depth, and further, the etching angle (taper angle) is determined corresponding to etching of the resist layer 12. The width $B_1$ on the deepest side of the concave portion 11a is the same value as the width $T_0$ of the opening portion 12a of the resist layer 12 without depending on the pattern depth and etching angle. Thus, the pattern cross-sectional shape formed using the method (B) meets Equation (2).

Selecting the method (A) or (B) is capable of being determined corresponding to application of the substrates with fine concavities and convexities and the heat-reactive resist material for dry etching.

In the fine concavo-convex structure product according to this Embodiment, the product having the pattern cross-sectional shape meeting Equation (1) is characterized in that the heat-reactive resist material for dry etching has, as a principal constituent element, at least one species selected from the group consisting of Cu, Nb, Sn, Mn, oxides thereof, nitrides thereof and NiBi. By this means, it is possible to efficiently manufacture the fine concavo-convex structure product having the pattern cross-sectional shape meeting Equation (1). Among the species, from the viewpoint of making the fine pattern finer, in the heat-reactive resist material for dry etching, it is preferable that oxides of Cu are selected as the principal constituent element.

In the fine concavo-convex structure product according to this Embodiment, the product having the pattern cross-sectional shape meeting Equation (2) is characterized in that the heat-reactive resist material for dry etching has, as a principal constituent element, at least one species selected from the group consisting of Cr, Fe, Co, Al, Ga, In, Hf, Pb, oxides thereof and nitrides thereof. By this means, it is possible to efficiently manufacture the fine concavo-convex structure product having the pattern shape meeting Equation (2).

Described below are the heat-reactive resist materials for dry etching suitable for manufacturing the fine concavo-convex structure product of the present invention.

The inventor of the present invention already found out that in dry etching using a fluorine-containing gas, elements such that the boiling point of the primary fluoride is 200° C. or more have high dry etching resistance, and that there is the tendency that dry etching resistance is higher as the boiling point of the primary fluoride is higher (International Publication No. 2010/044400 Pamphlet).

On the other hand, in the Bosch method and the like, used are a fluorine-containing gas (herein after, referred to as "etching gas") for etching the etch layer, and a fluorine-containing gas (herein after, referred to as "side wall protection gas") for side wall protection to protect the side wall of the etching layer formed by the etching gas. The inventor of the present invention noted that elements such that the boiling point of the primary fluoride is 200° C. or more have relatively high dry etching resistance to the side wall protection gas, while the tendency of the level of the side wall protection effect of the side wall protection gas does not coincide with the tendency of the level of dry etching resistance by the side wall protection gas.

In general, as the mechanism of dry etching using a fluorine-containing gas, there are (1) dry etching by a chemical phenomenon that a dry etching-target material reacts with the fluorine-containing gas to be a gas of the fluoride, and that the gas of the fluoride is removed, and (2) dry etching by a physical phenomenon that a dry etching-target material is sputtered by the fluorine-containing gas. Ordinary dry etching is to mainly use (1) dry etching by the chemical phenomenon, and in this case, as described above, by using an element such that the boiling point of the primary fluoride is high, it is possible to improve dry etching resistance.

On the other hand, the inventor of the present invention found out that in (2) dry etching by the physical phenomenon, the boiling point of the primary fluoride is always not correlated with dry etching resistance. Then, the inventor of the present invention conceived that the level of (2) dry etching by the physical phenomenon is correlated with the level of sputtering resistance to a fluorine gas, and that by using elements high in sputtering resistance, it is possible to obtain high dry etching resistance also to the side wall protection gas.

Further, the inventor of the present invention examined the relationship between the sputtering yield (see "Sputter Technology" published by KYORITSU SHUPPAN Co., Ltd. P. 15 to P. 18) that is an index relating to sputtering resistance and dry etching by the physical phenomenon in which sputtering occurs. As a result, it is found out that dry etching resistance to dry etching by the physical phenomenon varies periodically according to the atomic number in the same manner as in the sputtering yield, and that the tendency of dry etching resistance to dry etching by the physical phenomenon is significantly not dependent on an element to sputter.

Based on the above-mentioned knowledge, the inventor of the present invention found out that by using elements satisfying both (1) dry etching resistance to dry etching by the chemical phenomenon, and (2) dry etching resistance to dry etching by the physical phenomenon, it is possible to actualize heat-reactive resists having high resistance to the etching gas, while having high dry etching resistance also to the side wall protection gas, and arrived at the invention.

One Embodiment of the present invention will specifically be described below with reference to accompanying drawings.

A heat-reactive resist material for dry etching according to this Embodiment is a heat-reactive resist material for dry etching using a fluorine-containing gas such that a ratio (herein after, simply referred to as "F/C" also) of the number of fluorine atoms to the number of carbon atoms is 3 or less, or 2.7 or less, and is a heat-reactive resist material for dry etching in which a principal constituent element is at least one species selected from the group consisting of Cr, Fe, Co, Al, Ga, In, Hf, Pb, oxides thereof and nitrides thereof.

The heat-reactive resist material for dry etching according to this Embodiment is used in dry etching using a fluorine-containing gas such that F/C is 3 or less, more preferably, a fluorine-containing gas such that F/C is 2.7 or less. Herein, the fluorine-containing gas such that F/C is 3 or less is a gas such that a value: F[Fluorine]/C[Carbon]) obtained by dividing the number of fluorine atoms constituting the fluorine gas to use by the number of carbon atoms is 3 or less. The fluorine-containing gas such that F/C is 2.7 or less is the same. On general dry etching conditions, the side wall protection effect is produced by using the fluorine gas with F/C of 3 or less. Therefore, it is possible to use the fluorine gas with F/C of 3 or less as the side wall protection gas. Further, in the fluorine gas with F/C of 3 or less, as the value of F/C is smaller, the side wall protection effect is higher (herein after, "the fluorine gas with F/C of 3 or less" is also referred to as the "side wall protection gas".) The fluorine-containing gas with F/C of 2.7 or less has a higher side wall protection effect.

In the heat-reactive resist material for dry etching according to this Embodiment, a principal constituent element is at least one species selected from the group consisting of Cr, Fe, Co, Al, Ga, In, Hf, Pb, oxides thereof and nitrides thereof. In these elements, since the boiling point of the primary fluoride is 200° C. or more, it is possible to reduce dry etching by the chemical phenomenon that each element reacts with the fluorine-containing gas to be a gas of the fluoride, and that the gas of the fluoride is removed. In addition, in the element group Cr, Fe, Co, Al, Ga, In, Hf and Pb used in a dry etching-target material of the present invention, the boiling point of the primary fluoride is 950° C. or more, and it is thereby possible to significantly reduce dry etching by the chemical phenomenon. Further, since these elements have low sputtering yields, it is possible to reduce sputtering by the side wall protection gas, and it is possible to reduce dry etching by the physical phenomenon that the constituent element is removed by sputtering. In addition, for selection of elements low in the sputtering yield, in the data of the sputtering yield (see "Sputter Technology" published by KYORITSU SHUPPAN Co., Ltd. P. 15 to P. 18) that is an index relating to sputtering resistance, it is preferable to select elements such that the sputtering yield is one-half the sputtering yield of Ag in using Ar gas. In other words, the element group Cr, Fe, Co, Al, Ga, In, Hf and Pb used in the dry etching-target material of the present invention is characterized by being comprised of elements such that the boiling point of the primary fluoride is 950° C. or more, and that the sputtering yield is one-half the sputtering yield of Ag in using Ar gas. Accordingly, according to the heat-reactive resist material for dry etching according to this Embodiment, also in the case of performing dry etching using the side wall protection gas, it is possible to actualize the heat-reactive resist material for dry etching excellent in dry etching resistance.

In this Embodiment, the principal constituent element in the heat-reactive resist material means that the content of the element selected from the group consisting of Cr, Fe, Co, Al, Ga, In, Hf, Pb, oxides thereof and nitrides thereof is 50 mol % or more of all elements constituting the heat-reactive resist material. The content of the element is preferably 60 mol % or more, more preferably 65 mol % or more, further preferably 70 mol % or more, further more preferably 75 mol % or more, most preferably 80 mol % or more, and further most preferably 85 mol % or more. As the content of the element is higher, it is possible to obtain higher dry etching resistance to dry etching using the side wall protection gas.

In the fine concavo-convex structure product, it is preferable that side walls of a plurality of concave portions are coated with fluorine-containing carbons (hereafter, also described as fluorocarbons). As described previously, the fine concavo-convex structure product of the present invention is formed by dry etching. In this dry etching step, by the side walls of the concave portions of the fine concavo-convex structure being coated with fluorine-containing carbons, it is possible to form the fine concavo-convex structure product of the invention i.e. the fine concavo-convex structure product having a taper angle. Accordingly, in the fine concavo-convex structure product of the invention, it is preferable that the side walls of the concave portions are coated with fluorine-containing carbons.

The side wall protection gas is not limited particularly, as long as the gas is a fluorine-containing gas such that a ratio (F/C) of the number of fluorine atoms to the number of carbon atoms is 3 or less, and when F/C is 2.7 or less, the effect is more exerted. Examples of the side wall protection gas are fluorine-containing gases such as $CHF_3$, $CH_2F_2$, $C_2F_6$, $C_3F_8$, $C_4F_6$, $C_4F_8$, $C_4F_{10}$, $C_5F_{10}$, $CCl_2F_2$, $CF_3I$, $CF_3Br$, $CHF_2COF$, and $CF_3COF$. These fluorine-containing gases may be used alone as the side wall protection gas, or mixed gases obtained by mixing these gases may be used as the side wall protection gas. Further, mixed gases obtained by mixing these fluorine-containing gases with other fluorine-containing gases such as $CF_4$ and $SF_6$ may be used as the side wall protection gas. Furthermore, it is possible to also use, as the side wall protection gas, mixed gases obtained by mixing the fluorine-containing gases as described above with gases such as $O_2$, $H_2$, Ar, $N_2$, CO, HBr, $NF_3$, HCl, HI, $BBr_3$, $BCl_3$, $Cl_2$ and $SiCl_4$, as long as the gases are capable of attaining the side wall protection effect in dry etching. By performing dry etching using these side wall protection gases while using the heat-reactive resist material for dry etching according to the invention as a mask, it is possible to control dry etching deep in the film thickness direction and etching angle (taper angle). In addition, for the dry etching depth in the film thickness direction, by using the heat-reactive resist material for dry etching according to the invention, as a matter of course, it is possible to form shallow depths, and it is also possible to form deep patterns exceeding 500 nm. In addition, it is possible to use in dry etching using fluorine-containing gases with F/C exceeding 3.

In this Embodiment, in the case of using fluorine-containing gases such as $CHF_3$, $C_3F_8$, $C_4F_8$ and mixed gases of $CHF_3$, $C_3F_8$ or $C_4F_8$ and $CF_4$ as the side wall protection gas, as the heat-reactive resist material for dry etching, it is preferable that the principal constituent element is at least one species selected from the group consisting of Cr, Co, Ga, Pb and oxides thereof. By this means, it is possible to control the fine pattern with high accuracy, and further, there is the advantage that the side wall protection gas is easily available. Further, in the case of using fluorine-containing gases such as $CHF_3$, $C_3F_8$, $C_4F_8$ and mixed gases of $CHF_3$, $C_3F_8$ or $C_4F_8$ and $CF_4$ as the side wall protection gas, as the heat-reactive resist material for dry etching, it is more preferable that the principal constituent element is at least one species selected from the group consisting of oxides of Cr, Co and Pb and Ga. Furthermore, from the viewpoint of easiness of manufacturing, as the heat-reactive resist material for dry etching, it is the most preferable that the principal constituent element is at least one species selected from the group consisting of oxides of Cr, Co and Pb.

For example, the fluorine-containing gases (side wall protection gases) are capable of being used in dry etching using RIE (Reactive Ion Etching), ECR (Electron Cyclotron Resonance) plasma etching, and microwave etching. Further, the fluorine-containing gases are not limited thereto, and are capable of being used in conventional publicly-known various etching methods.

In the heat-reactive resist material for dry etching according to this Embodiment, it is preferable to contain a heat-reactive resist material that enables a pattern to be formed by one of oxidation, decomposition, melting, phase change, coagulation and sublimation. Among the materials, it is preferable to contain a heat-reactive resist material that enables a pattern to be formed by one of oxidation, decomposition, melting and phase change. By selecting the heat-reactive resist material that enables a pattern to be formed by one of oxidation, decomposition, melting and phase change, it is possible to form a fine pattern.

The heat-reactive resist material for dry etching according to this Embodiment is distinct from a photoresist material, and for example, by exposing with laser light, it is possible to form a thermally reacted area in which the heat-reactive resist material thermally reacts and an unreacted area in which the material does not react inside a spot diameter (within the irradiation area) of laser light.

Figure 7:
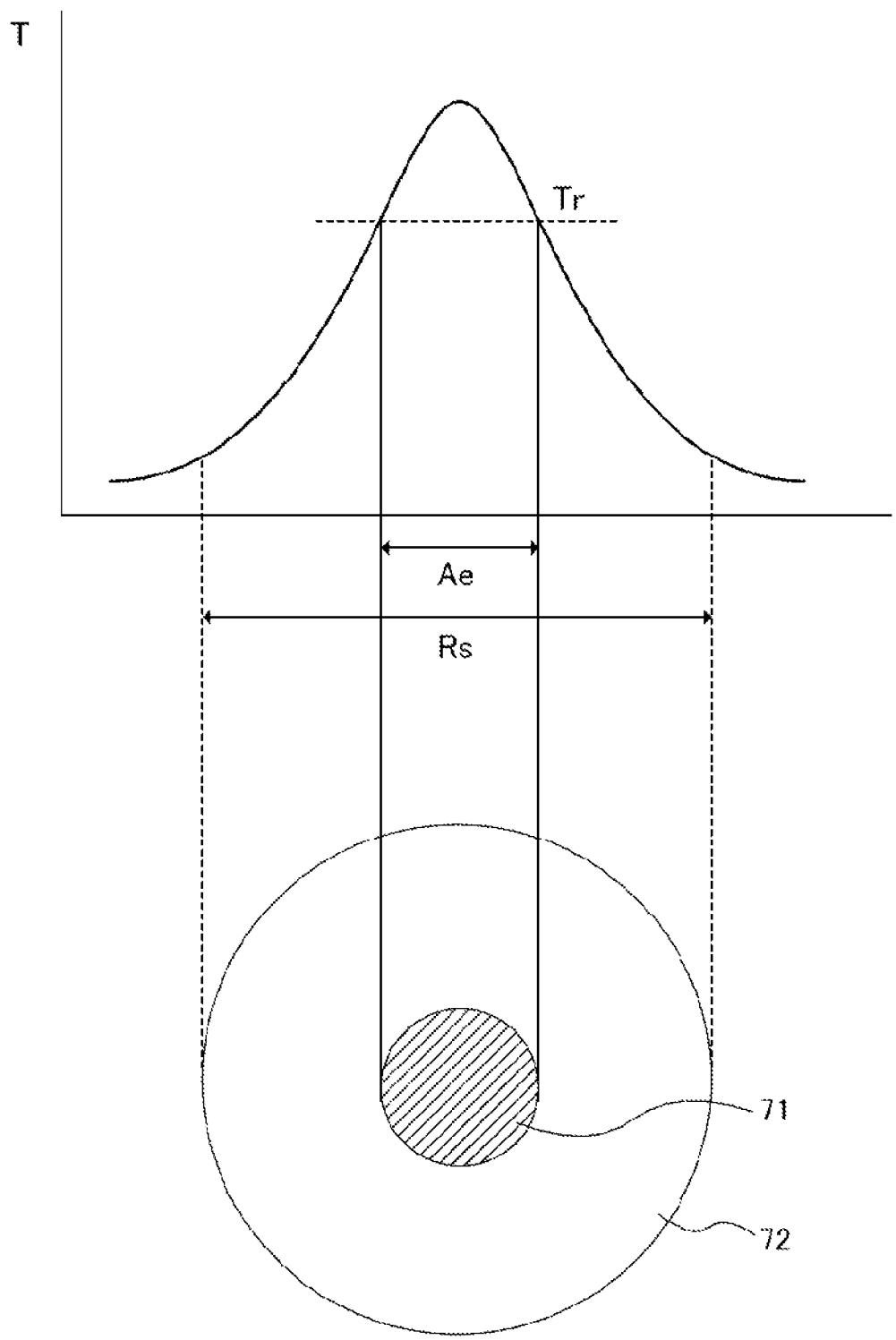
FIG. 7 is an explanatory diagram illustrating the relationship between the spot diameter (irradiation area) of laser light and the temperature distribution inside the spot diameter in irradiating a heat-reactive resist material with the laser light.

FIG. 7 is an explanatory diagram illustrating the relationship between the spot diameter (irradiation area) of laser light and the temperature distribution inside the spot diameter when the heat-reactive resist material is irradiated with the laser light. As shown in FIG. 7, when the laser light is applied substantially perpendicularly to the main surface of the heat-reactive resist material, the spot diameter Rs of the laser light is formed substantially in the shape of a circle on the main surface of the heat-reactive resist material with the focus of the laser light as the center. Herein, as shown in the upper portion of FIG. 7, the temperature distribution T inside the spot diameter Rs of the laser light has the peak near the focus of the laser light, and decreases as closed to the outer edges of the irradiation range Ae. In this case, by using a heat-reactive resist material reacting at a predetermined temperature, it is possible to selectively expose the portion near the focus of the laser light. In other words, the reaction occurs in an area 71 with high temperatures, while not occurring in an area 72 with low temperatures.

In other words, by providing the heat-reactive resist material with the area (71 in FIG. 7) in which the material reacts at the predetermined temperature (Tr; resist reaction temperature) or more with respect to the temperature distribution T occurring inside the spot diameter of laser, it is made possible to achieve the processing finer than the spot diameter Rs. By this means, in this Embodiment, it is possible to perform exposure using a semiconductor laser which is small-size and inexpensive and eliminates the need for specific equipment. For example, the wavelength of currently commercial semiconductor lasers with short wavelengths is about 405 nm, and the spot diameter is about 420 nm (aperture: 0.85). Therefore, the microprocessing of 420 nm or less is not capable of being performed in principle as long as photoresist materials are used, but by using the heat-reactive resist material, it is possible to exceed the limitations, and perform microprocessing less than the wavelength of the semiconductor laser.

The heat-reactive resist material for dry etching according to this Embodiment contains $CrO_x$ (0<X<3), and an additive, and it is preferable that the additive is formed by containing at least one selected from materials that do not form respective compounds with $CrO_x$ (0<X<3). Herein, the materials that do not form respective compounds with $CrO_x$ (0<X<3) are materials that do not form chemical bonds with $CrO_x$ (0<X<3). Whether or not to form a compound with $CrO_x$ (0<X<3) is confirmed from the phase diagram of oxide materials. By selecting the materials that do not form respective compounds with $CrO_x$ (0<X<3) as the additive, the heat-reactive resist material for dry etching is capable of exhibiting performance as the resist material.

The heat-reactive resist material for dry etching according to this Embodiment is a heat-reactive resist material for dry etching that contains $CrO_x$ (0<X<3), and an additive, and it is preferable that the additive is formed by containing at least one selected from the group consisting of Al, Si, Ni, Ge, Mo, Ru, Rh, Pd, Ag, In, Sn, Ta, Ir, Pt, Au, Bi, oxides thereof, nitrides thereof, and mixtures thereof. Since the above-mentioned additive is the material that does not form a compound with $CrO_x$ (0<X<3), the heat-reactive resist material for dry etching is capable of exhibiting performance as the resist material.

Further, as the additive, additives that do not form respective compounds with $CrO_x$ (0<X<3) by heating in exposure are preferable, and additives that do not form respective compounds with $CrO_x$ (0<X<3) on any conditions are more preferable.

In this Embodiment, in the case of placing importance on dry etching resistance, it is preferable that the additive is formed by containing at least one selected from the group consisting of Al, Si, Ni, Ru, Rh, Pd, Ag, In, Sn, Ta, Ir, Pt, Au, Bi, oxides thereof, nitrides thereof, and mixtures thereof. Further, in the case of placing importance on fine pattern formation capability, the additive is preferably formed by containing at least one selected from the group consisting of Al, Si, Ni, Ge, Mo, Ta, oxides thereof, nitrides thereof, and mixtures thereof, is more preferably formed by containing at least one selected from the group consisting of Si, Ge, Mo, Ta, oxides thereof, nitrides thereof, and mixtures thereof, is further preferably formed by containing at least one selected from the group consisting of Si, Ta, oxides thereof, nitrides thereof, and mixtures thereof, and is most preferably oxides of Si.

$InCrO_x$ (0<X<3) used in the heat-reactive resist material for dry etching according to this Embodiment, since the boiling point of the primary fluoride is 200° C. or more in dry etching, it is possible to reduce dry etching by the chemical phenomenon that the element reacts with the fluorine-containing gas to be a gas of the fluoride, and that the gas of the fluoride is removed. Further, since $CrO_x$ (0<X<3) has a low sputtering yield, it is possible to reduce sputtering by the side wall protection gas, and it is possible to reduce dry etching by the physical phenomenon that the constituent element is removed by sputtering. Accordingly, $CrO_x$ (0<X<3) used in the heat-reactive resist material for dry etching according to this Embodiment has excellent dry etching resistance, as a matter of course, in the case of performing dry etching using the side wall protection gas, also to the etching gases and various gas species for dry etching.

In the heat-reactive resist material for dry etching according to this Embodiment, it is preferable that the range of X of $CrO_x$ is (0<X<2). When the oxidation degree X is in this range, crystallization or oxidation proceeds abruptly by exposure, and it is possible to form a fine pattern. The range of X of $CrO_x$ is more preferably (0.2<X<1.5), further preferably (0.35<X<1.5), and most preferably (0.35<X<1.0). By setting the oxidation degree X in the preferable range, it is naturally possible to forma fine pattern, it is further possible to increase the development selection ratio (ratio in the development rate between a dissolved portion and an undissolved portion) in development, and such setting is suitable in manufacturing. It is possible to obtain the oxidation degree X using Rutherford Back Scattering analysis (RBS) and the like. In addition, in obtaining the oxidation degree X, to eliminate the effect from the additive, it is preferable to measure only using $CrO_x$.

The heat-reactive resist material for dry etching according to this Embodiment may contain a state in which oxidation degrees X are different in the material. For example, in depositing the heat-reactive resist material for dry etching using deposition by the sputtering method, by changing the concentration of oxygen as the condition of sputtering, it is possible to prepare a heat-reactive resist material for dry etching in which the oxidation degree differs in the film thickness direction. A manner for changing the concentration of oxygen may be continuous or non-continuous. As described above, in the heat-reactive resist material for dry etching according to this Embodiment, the development rate varies with the oxidation degree X. Accordingly, by forming a film with the oxidation degree X varied, it is possible to obtain materials with the development rate varied in the film thickness direction. For example, in the case where residuals tend to occur on the substrate surface, by placing the material with the oxidation degree X that increases the development rate on the substrate side, it is possible to suppress the residuals.

Further, the dry etching heat-reactive resist material according to this Embodiment contains the additive, and therefore, is amorphous. By this means, it is possible to suppress growth of crystals in the boundary portion between a thermally reacted area 82a and an unreacted area 82b in FIG. 8 described later, and the boundary portion is clear. By this means, it is possible to manufacture a mold having a fine pattern provided with a desired pattern shape.

Furthermore, the heat-reactive resist material for dry etching according to this Embodiment preferably contains silicon oxide as the additive. By containing silicon oxide, it is possible to form a better fine pattern.

In the heat-reactive resist material for dry etching according to this Embodiment, it is preferable that an additive amount of the additive ranges from 2.0 mol % to 35.0 mol % in terms of mole. By setting the additive amount in the range of 2.0 mol % to 35.0 mol %, the material has resist resistance excellent in dry etching resistance, and enables a fine pattern to be formed with ease. The additive amount of the additive preferably ranges from 2.0 mol % to 25.0 mol %, more preferably ranges from 5.0 mol % to 15.0 mol %, and most preferably ranges from 6.0 mol % to 12.0 mol %. By setting the additive amount of the additive in the above-mentioned range, it is possible to form a fine pattern having a clear pattern shape.

A method of manufacturing a mold according to this Embodiment will be described next with reference to FIG. 8. FIG. 8 contains cross-sectional schematic diagrams illustrating each step of the method of manufacturing a mold according to this Embodiment.

As shown in FIG. 8, the method of manufacturing a mold 80 according to this Embodiment has a step (1) of providing, on a substrate 81, a heat-reactive resist layer 82 containing the heat-reactive resist material for dry etching according to this Embodiment as described above, a step (2) of exposing the heat-reactive resist layer 82, then developing and forming masks 82c, a step (3) of performing dry etching on the substrate 81 via the masks 82c using the fluorine-containing gas (side wall protection gas) such that the value (F/C) obtained by dividing the number of fluorine atoms by the number of carbon atoms is 3 or less, or 2.7 or less, and a step (4) of removing the heat-reactive resist layer 82 to manufacture the mold 80.

In the step (1), on the substrate 81 is deposited the heat-reactive resist layer 82 containing the heat-reactive resist material for dry etching according to this Embodiment as described above (FIGS. 8A and 8B). As the substrate 81, from the viewpoint of performing dry etching on the substrate 81 to manufacture the mold 80 in the step (3) described later, substrates allowed to undergo dry etching are used. As the substrate 81, for example, silicon, quartz and the like are preferable, and quartz is more preferable.

As the substrate 81, it is possible to use both the shape of a plate and the shape of a sleeve (roll, drum). When the plate-shaped substrate 81 is used, the plate-shaped mold 80 is obtained, and when the sleeve-shaped substrate 81 is used, the sleeve-shaped mold 80 is obtained. Herein, since many molds for use in the original disk of optical disks, Nanoimprint and the like are small and in the shape of a plate, it is possible to transfer with a simplified apparatus. On the other hand, in the case of transferring to a large area with a plate-shaped mold, it is necessary to prepare a large mold, and it is further necessary to uniformly provide the pattern on the entire surface of the large mold, to apply the press pressure uniformly to the entire surface of the mold in transferring, and to peel off the large mold neatly from the transfer-targeted material. In the conventional sleeve-shaped mold, transfer of a pattern to a large area is easy, but it has been difficult to form a pattern of the size of submicron (1 μm or less) by laser processing and mechanical processing. In contrast thereto, according to the method of manufacturing a mold according to this Embodiment, it is not only possible to manufacture the plate-shaped mold 80, it is also possible to form a pattern of the size of submicron in the case of manufacturing the sleeve-shaped mold 80, and it is possible to transfer a fine pattern of the size of submicron to a large area.

Further, as the substrate 81, it is also possible to use substrates hard to undergo dry etching. In this case, a dry etching layer (not shown) is provided between the substrate 81 and the heat-reactive resist layer 82. The dry etching layer is not limited particularly, as long as the layer is capable of undergoing dry etching, and for example, it is possible to use Si, Ta, Ge, Te, P, oxides thereof, nitrides thereof, carbides thereof, oxides of Mo and W, silicides of Mo and W, and the like. Among the materials, from the viewpoints of easiness of film formation of the dry etching layer, temporal stability, strength, costs and the like, it is the most preferable to use materials selected from the group consisting of Si, Ta, oxides thereof and nitrides thereof.

The heat-reactive resist layer 82 and the dry etching layer provided as necessary are preferably provided using the sputtering method, vapor deposition method or CVD method. Since the heat-reactive resist material for dry etching forming the heat-reactive resist layer 82 allows fine pattern processing of the level of tens of nanometers, depending on the size of the fine pattern, it is conceivable that there are extremely significant effects of the film thickness distribution and concavities and convexities of the surface of the heat-reactive resist material for dry etching in film formation. By providing the heat-reactive resist layer 82 using the sputtering method, vapor deposition method or CVD method, it is possible to suppress these effects.

Generally, in the heat-reactive resist material, the material with a thick film thickness is high in resistance to dry etching and therefore, has the advantage, but by thickening the film thickness, uniformity in the film thickness direction by exposure is lost, and the problem arises that processing accuracy of the fine pattern degrades. Accordingly, as a film thickness of the heat-reactive resist material for dry etching according to the invention, the thickness is preferably 150 nm or less, more preferably 100 nm or less, further preferably 60 nm or less, and most preferably 40 nm or less. By using the resist material for dry etching according to this Embodiment, since there is sufficient resistance to dry etching, it is possible to thin the film thickness and improve processing accuracy of the fine pattern.

Further, a heat absorption layer (not shown) may be layered on the heat-reactive resist layer 82. By providing the heat absorption layer, it is possible to widen the selection range of absorption characteristics of light in the heat-reactive resist layer 82. Generally, there are many cases that the heat-reactive resist layer 82 is comprised of a material having absorption at wide wavelengths, but some heat-reactive resist materials for dry etching do not have optical absorption at wavelengths of the semiconductor laser, for example, near 405 nm. In this case, the heat absorption layer absorbs energy of a laser to transform to heat, and by the heat, the heat-reactive resist layer 82 is capable of reacting.

Suitable as materials for use in the heat absorption layer are materials having light absorption at wavelengths of a laser, and examples thereof are elements selected from the group consisting of C, Mg, Al, Si, Ti, V, Cr, Mn, Fe, Co, Ni, Cu, Zn, Ge, Se, Zr, Nb, Mo, Pd, Ag, In, Sn, Sb, Te, Hf, Ta, W, Pt, Au, Pb, and Bi and their alloys. Further, the materials may be oxides, nitrides, sulfides, and carbides containing these elements and mixtures thereof.

Further, when necessary, the heat-reactive resist layer 82 can be of heat dissipation design or heat insulation design. The heat dissipation design is designed when it is necessary to dissipate thermal energy of the portion heated by irradiation of the laser as fast as possible. The heat dissipation design is effective in the case where heat is kept, the reaction thereby proceeds by heat in the area wider than the spot shape of the thermal reaction by exposure, and it is not possible to obtain a desired shape. On the other hand, the heat insulation design is designed when it is necessary to prevent dissipation of thermal energy in the portion heated by irradiation of the laser. Generally, the mold is prepared using metal, glass or the like rich in workability. However, since the metal and glass has high thermal conductivity, such a phenomenon may occur that thermal energy in the portion heated by irradiation of the laser escapes to the mold. Accordingly, to heat the exposed portion to the reaction temperature of the heat-reactive resist layer 82, a laser with a higher output is required. Increases in output of the laser lead to increases in size of the optical component and reductions in laser life, and are not suitable. Therefore, by the heat insulation design, by providing the heat insulation layer on the mold 80 side, dissipation of heat is prevented, and it is possible to use energy of the laser more efficiently.

Next, in the step (2), exposure causes the thermal reaction of the heat-reactive resist material for dry etching of the heat-reactive resist layer 82 to form thermally reacted areas 82*a* in a part of the heat-reactive resist layer 82. The areas except the thermally reacted areas 82*a* of the heat-reactive resist layer 82 are the unreacted areas 82*b* (FIG. 8C). Next, by dissolving either the thermally reacted areas 82*a* or the unreacted areas 82*b* using the developing solution to remove, masks 82*c* (fine pattern) are formed (FIG. 8D).

The developing solution is not limited particularly, and for example, it is possible to use an acid, alkali solution and the like. As an acidic solution, it is possible to use common solutions, alone or as a mixed solution, such as hydrochloric acid, sulfuric acid, nitric acid, phosphoric acid, acetic acid, oxalic acid and hydrofluoric acid. Further, as an alkali solution, it is possible to use common solutions, alone or as a mixed solution, such as sodium hydroxide, potassium hydroxide, sodium carbonate, ammonium and TMAH (tetramethyl ammonium hydroxide). Further, it is possible to add a potential adjustment agent such as hydrogen peroxide and manganese dioxide, or the like to the developing solution. Furthermore, it is also possible to add a surfactant or the like to the developing solution to improve wettability.

Further, as the developing solution, in the case of removing the thermally reacted area 82*a*, used are solutions such that the thermally reacted area 82a is soluble in the solutions to use and that the unreacted area 82a has resistance to the solutions. Furthermore, in the case of removing the unreacted area 82b, used are solutions such that the unreacted area 82b is soluble in the solutions to use and that the thermally reacted area 82a has resistance to the solutions.

Figure 8A:
FIGS. 8A, 8B, 8C, 8D, 8E, and 8F contain cross-sectional schematic diagrams illustrating each step of a mold manufacturing method according to this Embodiment.
Figure 8B:
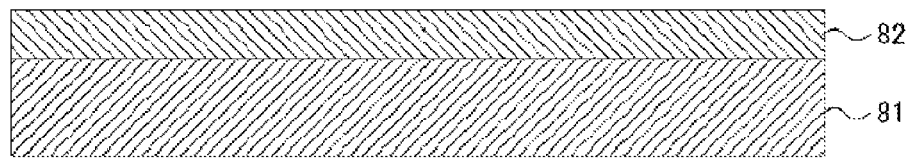
Figure 8C:
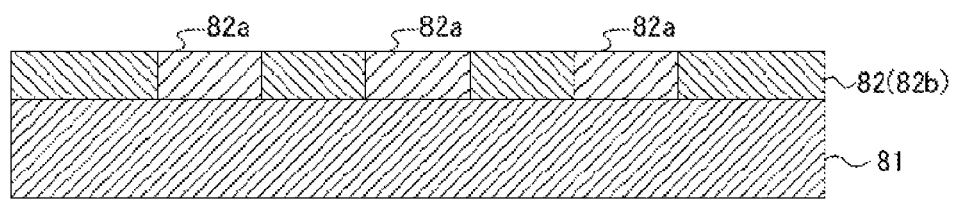
Figure 8D:
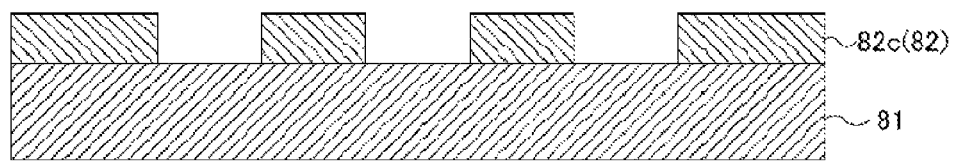
Figure 8E:
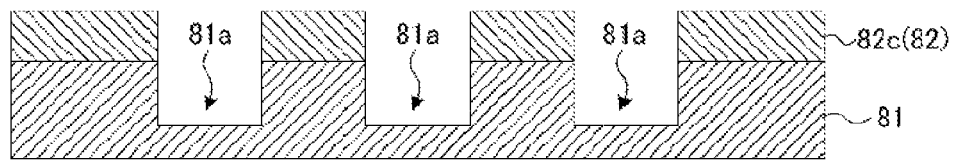

Next, in the step (3), the substrate 81 is subjected to dry etching via the masks 82c formed by patterning the heat-reactive resist layer 82 to form concave portions 81a on the substrate 81 (FIG. 8E). Herein, in the method of manufacturing a mold according to this Embodiment, since the masks 82c (heat-reactive resist layer 82) contain the heat-reactive resist material for dry etching as described above, also in the case of using the fluorine-containing gas (side wall protection gas) such that the ratio (F/C) of the number of fluorine atoms to the number of carbon atoms is 3 or less, or 2.7 or less, the masks 82c have high dry etching resistance. By this means, it is possible to reduce etching amounts of the masks 82c, and it is thereby possible to form a fine pattern with a high aspect ratio. As the conditions of dry etching, the conditions are not limited particularly, as long as it is possible to etch the substrate 81 using the fluorine-containing gas such that the ratio (F/C) of the number of fluorine atoms to the number of carbon atoms is 3 or less, or 2.7 or less.

Figure 8F:
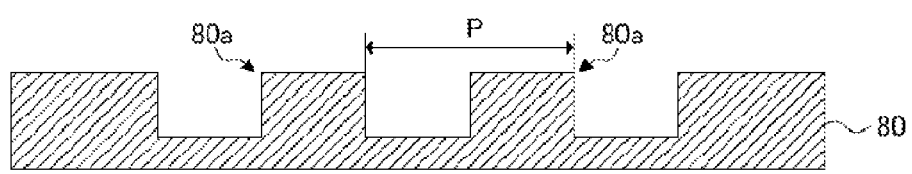

Next, in the step (4), the masks 82c (heat-reactive resist layer 82) are removed to manufacture the mold 80 (FIG. 8F). The masks 82c (heat-reactive resist layer 82) are not limited particularly, as long as there is no effect on the substrate 81 (dry etching layer), and it is possible to use wet etching, dry etching and the like. In the case of removing the masks 82c (heat-reactive resist layer 82) by wet etching or dry etching, used is an etchant or reactive gas such that the substrate 81 has resistance thereto and that the thermally reacted areas 82a or unreacted areas 82b have solubility or reactivity.

Described next is a method of manufacturing a mold using the heat-reactive resist material for dry etching containing $CrO_x$ (0<X<3) and additive according to this Embodiment particularly in the present invention. FIGS. 8A to 8F are diagrams illustrating the general outlines of the method of manufacturing a mold 80 according to this Embodiment. As shown in FIG. 8A to 8F, the method of manufacturing a mold 80 according to this Embodiment has a step (1) of providing, on a substrate 81, a heat-reactive resist layer 82 containing the heat-reactive resist material for dry etching, a step (2) of exposing the heat-reactive resist layer 82, then developing the heat-reactive resist layer 82, and forming masks 82c, a step (3) of performing dry etching on the substrate 81 via the masks 82c, and a step (4) of removing the heat-reactive resist layer 82 to manufacture the mold 80.

First, in the step (1), on the substrate 81 is deposited the heat-reactive resist material for dry etching containing $CrO_x$ (0<X<3) and the additive by the sputtering method or the like, and the heat-reactive resist layer 82 is provided (FIGS. 8A and 8B). In addition, deposition of the heat-reactive resist layer 82a is not limited to the sputtering method, and it is possible to apply various deposition methods. As the substrate 81, from the viewpoint of performing dry etching on the substrate 81 to manufacture the mold 80 in the step (3) described later, substrates allowed to undergo dry etching are used. As the substrate 81, for example, silicon, quartz and the like are preferable, and silicon is more preferable.

Next, in the step (2), exposure causes the thermal reaction of the heat-reactive resist material for dry etching of the heat-reactive resist layer 82 to form the thermally reacted areas 82a in a part of the heat-reactive resist layer 82. The areas except the thermally reacted areas 82a of the heat-reactive resist layer 82 are the unreacted areas 82b (FIG. 8C). At this point, in this Embodiment, since the heat-reactive resist layer 82 contains the heat-reactive resist material containing $CrO_x$ (0<X<3) and the additive, it is possible to suppress growth of crystals of the heat-reactive resist material in the boundary area between the thermally reacted area 82a and the unreacted area 82b in exposure. Next, by dissolving either the thermally reacted areas 82a or the unreacted areas 82 busing the developing solution to remove, masks 82c (fine pattern) are formed (FIG. 8D). Herein, since there is no crystal in the boundary area between the thermally reacted area 82a and the unreacted area 82b, the boundary between the thermally reacted area 82a and the unreacted area 82b is clear, and it is possible to form masks 82c having a clear pattern by exposure and development.

It is preferable to perform development in the step (2) by wet etching. As the developing solution, for example, it is possible to use a mixed solution of ceric ammonium nitrate and hydrogen peroxide that is a generally used acidic etchant, alkali etchant and the like. Further, it is also possible to add a surfactant or the like to the developing solution to improve wettability.

Next, in the step (3), the substrate 81 is subjected to dry etching using a fluorine-containing gas via the masks 82c formed by patterning the heat-reactive resist layer 82 to form concave portions 81a on the substrate 81 (FIG. 8E). Herein, in the method of manufacturing a mold according to this Embodiment, since the masks 82c (heat-reactive resist layer 82) contain the heat-reactive resist material for dry etching as described above, not only in the case of performing dry etching using the side wall protection gas as the fluorine-containing gas, also in the case of performing dry etching using an etching gas and various fluorine-containing gases, the masks 82 have high dry etching resistance. By this means, also in the case of performing dry etching for a long time, it is possible to reduce etching amounts of the masks 82c, and it is thereby possible to form a fine pattern with a high aspect ratio. As a result, it is possible to manufacture the mold 80 provided with an optional pattern such as dry etching deep in the film thickness direction, control of the etching angle (taper angle) and the like.

In the step (3), as the conditions of dry etching, the conditions are not limited particularly, as long as it is possible to perform dry etching on the substrate 81 using the fluorine-containing gas. In addition, as the fluorine-containing gas used in dry etching of the substrate 81, from the viewpoint of easiness in control of the pattern shape of the concavo-convex structure of the obtained mold 80, it is preferable to use the fluorine-containing gas (side wall protection gas) such that the value (F/C) obtained by dividing the number of fluorine atoms by the number of carbon atoms is 3 or less. Particularly, in the case of using $CrO_x$, it is more preferable that F/C is 2.7 or less in terms of obtaining the side wall protection effect, and in the case of the conditions, it is easier to control the structure having the taper angle.

Next, in the step (4), the masks 82c (heat-reactive resist layer 82) are removed to manufacture the mold 80 (FIG. 8F). The masks 82c are not limited particularly, as long as there is no effect on the substrate 81 or a dry etching layer described later, and it is possible to use wet etching, dry etching and the like. In the case of removing the masks 82c by wet etching or dry etching, used is an etchant or reactive gas such that the substrate 81 has resistance thereto and that the thermally reacted areas 82a or unreacted areas 82b have solubility or reactivity.

Removal of the masks 82c in the step (4) is not limited particularly, as long as there is no effect on the substrate 81 or the dry etching layer as described later, and it is possible to use wet etching, dry etching and the like. In the case of removing the masks 82c by wet etching, it is possible to remove the masks 82c by changing the potential of the developing solution used in development of the heat-reactive resist layer 82.

Materials used in each of steps (1) to (4) and the like will specifically be described below.

As the substrate 81, it is possible to use both the shape of a plate and the shape of a sleeve. The sleeve-shaped substrate may be in the shape of a roll or the shape of a drum. When the plate-shaped substrate 81 is used, the plate-shaped mold 80 is obtained, and when the sleeve-shaped substrate 81 is used, the sleeve-shaped mold 80 is obtained. Herein, since many molds for use in the original disk of optical disks, Nanoimprint and the like are small and in the shape of a plate, it is possible to transfer with a simplified apparatus. On the other hand, in the case of transferring to a large area with a plate-shaped mold, it is necessary to prepare a large mold, and it is further necessary to uniformly provide the pattern on the entire surface of the large mold, to apply the press pressure uniformly to the entire surface of the mold in transferring, and to peel off the large mold neatly from the transfer-targeted material. In the conventional sleeve-shaped mold, transfer of a pattern to a large area is easy, but it has been difficult to form a pattern of the size of submicron (1 μm or less) by laser processing and mechanical processing. In contrast thereto, according to the method of manufacturing a mold according to this Embodiment, it is not only possible to manufacture the plate-shaped mold 80, it is also possible to form a pattern of the size of submicron in the case of manufacturing the sleeve-shaped mold 80, and it is possible to transfer a fine pattern of the size of submicron to a large area.

Further, as the substrate 81, as described above, from the viewpoint of performing dry etching to manufacture the mold, it is preferable to use substrates allowed to undergo dry etching. As the substrate, silicon, quartz and the like are preferable, and from the viewpoint of preparing the sleeve-shaped mold, quartz is more preferable.

Further, as the substrate 81, it is also possible to use substrates hard to undergo dry etching. In this case, a dry etching layer (not shown) is provided between the substrate 81 and the heat-reactive resist layer 82 as necessary. The dry etching layer is not limited particularly, as long as the layer is capable of undergoing dry etching, and for example, it is possible to use Si, Ta, Ge, Te, P, oxides thereof, nitrides thereof, carbides thereof, oxides of Mo and W, silicides of Mo and W, and the like. Among the materials, from the viewpoints of easiness of film formation of the dry etching layer, temporal stability, strength, costs and the like, it is the most preferable to use materials selected from the group consisting of Si, Ta, oxides thereof and nitrides thereof.

The heat-reactive resist layer 82 and the dry etching layer provided as necessary are preferably provided using any method selected from among the sputtering method, vapor deposition method and CVD method. Since the heat-reactive resist material for dry etching forming the heat-reactive resist layer 82 allows fine pattern processing of the level of tens of nanometers, depending on the size of the fine pattern, it is conceivable that there are extremely significant effects of the film thickness distribution and concavities and convexities of the surface of the heat-reactive resist material for dry etching in film formation. Therefore, to reduce the effects as much as possible, it is preferable to form the heat-reactive resist material using any film formation method selected from among the sputtering method, vapor deposition method and CVD method, rather than the film formation method such as a coating method and spray method that are a little difficult in control of uniformity of the film thickness or the like.

Further, a heat absorption layer (not shown) may be layered on the heat-reactive resist layer 82. By providing the heat absorption layer, it is possible to widen the selection range of absorption characteristics of light in the heat-reactive resist layer 82, and to raise the temperature of the heat-reactive resist layer efficiently. Generally, there are many cases that the heat-reactive resist layer 82 is comprised of a material having absorption at wide wavelengths, but some heat-reactive resist materials for dry etching do not have optical absorption at wavelengths of the semiconductor laser, for example, near 405 nm. In this case, the heat absorption layer absorbs energy of a laser to transform to heat, and by the heat, the heat-reactive resist material 82 is capable of reacting.

Suitable as materials for use in the heat absorption layer are materials having light absorption at wavelengths of a laser, and examples thereof are elements selected from the group consisting of C, Mg, Al, Si, Ti, V, Cr, Mn, Fe, Co, Ni, Cu, Zn, Ge, Se, Zr, Nb, Mo, Pd, Ag, In, Sn, Sb, Te, Hf, Ta, W, Pt, Au, Pb, and Bi and their alloys. Further, the materials may be oxides, nitrides, sulfides, and carbides containing these elements and mixtures thereof.

Further, when necessary, the heat-reactive resist layer 82 can be of heat dissipation design or heat insulation design. The heat dissipation design is designed when it is necessary to dissipate thermal energy of the portion heated by irradiation of the laser as fast as possible. The heat dissipation design is effective in the case where heat is kept, the reaction thereby proceeds by heat in the area wider than the spot shape of the thermal reaction by exposure, and it is not possible to obtain a desired shape. On the other hand, the heat insulation design is designed when it is necessary to prevent dissipation of thermal energy in the portion heated by irradiation of the laser. Generally, the mold is prepared using metal, glass or the like rich in workability. However, since the metal and glass has high thermal conductivity, such a phenomenon may occur that thermal energy in the portion heated by irradiation of the layer escapes to the mold. Accordingly, to heat the exposed portion to the reaction temperature of the heat-reactive resist layer 82, a laser with a higher output is required. Increases in output of the laser lead to increases in size of the optical component and reductions in laser life, and are not suitable. Therefore, by the heat insulation design, by providing the heat insulation layer on the mold 80 side, dissipation of heat is prevented, and it is possible to use energy of the laser more efficiently.

In the method of manufacturing a mold according to this Embodiment, the film thickness of the heat-reactive resist layer 82 preferably ranges from 10 nm to 80 nm. Generally, in the heat-reactive resist material, the material with a thick film thickness is high in resistance to dry etching and therefore, has the advantage, but by thickening the film thickness, uniformity in the film thickness direction by exposure is lost, and the problem arises that processing accuracy of the fine pattern degrades. Accordingly, as the film thickness of the heat-reactive resist material for dry etching according to this Embodiment, the thickness is preferably 80 nm or less, more preferably 50 nm or less, further preferably 40 nm or less, and most preferably 30 nm or less. On the other hand, when the film thickness is 10 nm or more, it is possible to prevent absorption efficiency of heat by the laser from decreasing. By using the heat-reactive resist material according to this Embodiment, since there is sufficient resistance to dry etching, it is possible to thin the film thickness and improve processing accuracy of the fine pattern.

As the laser used in exposure of the heat-reactive resist layer 82, it is possible to use excimer lasers such as KrF and ArF lasers, semiconductor lasers, electron beam and X-ray. The excimer lasers such as KrF and ArF lasers are remarkably large-size expensive apparatuses, electron beam and X-ray require using a vacuum chamber, and there are significant limitations from the viewpoints of the cost and increases in the size. Accordingly, it is preferable to use semiconductor lasers that enable the light-source apparatus to be extremely small-size and that are inexpensive. In general, it is made possible to form a fine pattern by reducing the wavelength of the exposure light source using the electron beam, excimer laser, or the like, and the heat-reactive resist material for dry etching according to this Embodiment enables a fine pattern to be formed adequately even using the semiconductor laser.

As the fluorine-containing gas used in dry etching of the substrate 81, etching gases used in general dry etching may be used. As the etching gases, there are fluorine-containing gases such as $CF_4$ and $SF_6$, and the gases may be used alone or a plurality of gases may be mixed to use. Further, mixed gases obtained by mixing the fluorine-containing gases as described above with gases such as $O_2$, $H_2$, Ar, $N_2$, CO, HBr, $NF_3$, HCl, HI, $BBr_3$, $BCl_3$, $Cl_2$ and $SiCl_4$ are also in the scope of the fluorine-containing gas.

For example, the fluorine-containing gases are capable of being used in dry etching using RIE (Reactive Ion Etching), ECR (Electron Cyclotron Resonance) plasma etching, and microwave etching. Further, the fluorine-containing gases are not limited thereto, and are capable of being used in conventional publicly-known various etching methods.

The developing solution is not limited particularly, and for example, it is possible to use an acid, alkali solution and the like. As an acidic solution, it is possible to use common solutions, alone or as a mixed solution, such as hydrochloric acid, sulfuric acid, nitric acid, phosphoric acid, acetic acid, oxalic acid hydrofluoric acid, and ceric ammonium nitrate. Further, as an alkali solution, it is possible to use common solutions, alone or as a mixed solution, such as sodium hydroxide, potassium hydroxide, sodium carbonate, ammonium and TMAH (tetramethyl ammonium hydroxide). Further, it is possible to add a potential adjustment agent such as hydrogen peroxide and manganese dioxide, or the like to the developing solution. Furthermore, it is also possible to add a surfactant or the like to the developing solution to improve wettability.

Further, as the developing solution, in the case of removing the thermally reacted area 82a, used are solutions such that the thermally reacted area 82a is soluble in the developing solutions to use and that the unreacted area 82a has resistance to the solutions. Furthermore, in the case of removing the unreacted area 82b, used are solutions such that the unreacted area 82b is soluble in the solutions to use and that the thermally reacted area 82a has resistance to the solutions.

As described above, according to the method of manufacturing the mold 80 according to this Embodiment as described above, an amorphous state is made in the heat-reactive resist layer 82 formed of the heat-reactive resist material for dry etching containing $CrO_x$ (0<X<3) and the additive, and it is thereby possible to suppress growth of crystals in the boundary area between the thermally reacted area 82a formed in the heat-reactive resist layer 82 by exposure and the unreacted area 82b. By this means, the boundary between the thermally reacted area 82a and the unreacted area 82b is clear, and it is thereby possible to form masks 82c having a clear pattern by exposure and development. Then, since the masks 82c contain $CrO_x$ (0<X<3) as the heat-reactive resist material for dry etching, it is possible to obtain excellent dry etching resistance not only to the side wall protection gas and also to general fluorine-containing gases used in dry etching, and therefore, it is possible to reduce etching amounts of the masks even in performing dry etching for a long time in the step (3). Due to these results, it is possible to form grooves with sufficient depths in the film thickness direction, and to actualize the method of manufacturing the mold 80 easy to control the etching angle.

A mold according to this Embodiment is manufactured by the method of manufacturing a mold as described above. According to the method of manufacturing a mold according to this Embodiment, it is possible to manufacture a mold having a fine pattern with a pitch (pitch P between adjacent convex portions 80a) of the concavo-convex structure ranging from 1 nm to 1 μm (see FIG. 8F). In addition, the pitch herein may always not be the pitch between adjacent convex portions 80a of the concavo-convex structure, and may be a pitch between adjacent concave portions. Further, although the shape of the concavo-convex structure is not limited particularly, there are the shape of line and space, the shape of dots, the shape of a long hole and the like, and these shapes may coexist. Further, as the cross-sectional structure of the concavo-convex structure, there are the shape of a triangle, the shape of a doom, the shape of a lens and the like.

EXAMPLES

The present invention will specifically be described below using the Examples performed to clarify the effects of the invention. In addition, the invention is not limited at all by the following Examples.

Example 1

As a heat-reactive resist material for dry etching, CrO and $Co_3O_4$ were used. As a substrate, plate-shaped quartz with 50 mm Φ was used.

First, a heat-reactive resist layer containing the heat-reactive resist material for dry etching was deposited on the substrate in a thickness of 20 nm by the sputtering method. As a target, CrO and $Co_3O_4$ were used. Conditions of deposition are shown in following Table 1.

Next, the deposited heat-reactive resist for dry etching layer was exposed to form thermally reacted areas in the heat-reactive resist layer. Exposure conditions are shown below. In this Example, to examine exposure accuracy, exposure was made so that the heat-reactive resist layer was a continuous groove-shaped pattern. In addition, as the shape of the heat-reactive resist pattern, by modulating the intensity of a laser during exposure, it is possible to form various patterns such as the shape of a circle and the shape of an oval according to application of the mold to manufacture.

Wavelength of semiconductor laser for exposure: 405 nm
Lens aperture: 0.85
Exposure laser power: 1 mV~10 mV
Feed pitch: 120 nm~350 nm Next, the exposed heat-reactive resist layer was developed. A wet step was used in development. Using a developing solution, the thermally reacted areas of the heat-reactive resist layer were dissolved, removed and developed at room temperature. Conditions of the development are shown in following Table 1. When a surface shape of the developed heat-reactive resist material was observed by SEM, a pattern with an opening width A shown in following Table 2 was formed.

Next, using the heat-reactive resist layer with the pattern formed as a mask, dry etching was performed on the substrate. Dry etching was carried out on the conditions that the processing gas pressure was 5 Pa, processing power was 300 W and that processing time was 60 minutes, using a fluorine-containing gas (F/C=2.7) obtained by mixing $CF_4$ and $C_4F_8$ in a ratio of 70 vol %:30 vol % as the etching gas. After etching, when a cross-sectional shape was observed by SEM, a fine pattern with an opening width B shown in following Table 2 was formed. Further, an etching shape with a taper angle added by the side wall protection effect was formed with the opening width A of the pattern of the heat-reactive resist layer maintained.

Example 2

As a heat-reactive resist material for dry etching, GaSb was used. As a substrate, sleeve-shaped quartz with Φ80 mm was used.

First, a heat-reactive resist layer containing the heat-reactive resist material for dry etching was deposited on the sleeve-shaped substrate in a thickness of 40 nm by the sputtering method. As a target, a GaSb target was used. Conditions of deposition are shown in following Table 1.

Next, the heat-reactive resist material for dry etching layer deposited on the sleeve-shaped substrate was exposed to form thermally reacted areas in the heat-reactive resist layer. Exposure conditions are shown below.
  Wavelength of semiconductor laser for exposure: 405 nm
  Lens aperture: 0.85
  Exposure laser power: 1 mV~25 mV
  Feed pitch: 120 nm~350 nm
  Rotation speed: 210 rpm~1670 rpm Next, the exposed heat-reactive resist layer was developed. A wet step was used in development. Using a developing solution, the thermally reacted areas of the heat-reactive resist layer were dissolved, removed and developed at room temperature. Conditions of the development are shown in following Table 1. When a surface shape of the developed heat-reactive resist material was observed by SEM, a pattern with an opening width A shown in following Table 2 was formed.

Next, using a UV curable resin, the pattern shape of the developed heat-reactive resist layer was transferred to a film. When a surface shape of the film with the pattern shape transferred was observed by SEM, a pattern with an opening width A shown in following Table 2 was formed.

Next, using the heat-reactive resist layer with the pattern formed as a mask, dry etching was performed on the substrate. Dry etching was carried out on the conditions that the processing gas pressure was 5 Pa, processing power was 300 W and that processing time was 25 minutes, using $C_3F_8$ gas (F/C=2.6) as the etching gas. After etching, a surface shape was transferred to a film using a UV curable resin. When a surface shape of the obtained film was observed by SEM, a pattern with an opening width B shown in Table 2 was formed, and an etching shape with a taper angle added by the side wall protection effect was formed with the opening width A of the heat-reactive resist layer maintained.

TABLE 1

| Resist material | Target | Rate of $O_2$ (vol %) | Pressure (Pa) | Developing solution | Development time (Min) |
|---|---|---|---|---|---|
| Example 1 | CrO | CrO (3inΦ) | 2 | 0.1 | Ceric ammonium nitrate + Nitric acid | 0.5 |
|  | $Co_3O_4$ | $Co_3O_4$ (3inΦ) | 10 | 0.1 | Hydrochloric acid | 10 |
| Example 2 | GaSb | GaSb (3inΦ) | 5 | 0.5 | Hydrochloric acid | 3 |

TABLE 2

| Resist material | Fluorine-containing gas | Opening width A (nm) | Opening width B (nm) |
|---|---|---|---|
| Example 1 | CrO | $CF_4$ (70 vol %) | 170 | 170 |
|  | $Co_3O_4$ | $C_4F_8$ (30 vol %) F/C = 2.7 | 125 | 125 |
| Example 2 | GaSb | $C_3F_8$ (100 vol %) F/C = 2.6 | 100 | 100 |

As can be seen from Table 2, since the heat-reactive resist material for dry etching according to the present invention has high resistance to dry etching using the fluorine-containing gas (side wall protection gas) such that the ratio of the number of fluorine atoms to the number of carbon atoms is 3 or less, the opening width A and the opening width B before and after dry etching are almost the same. As a result, by using the heat-reactive resist material for dry etching according to the present invention, it is possible to obtain high dry etching resistance also to the fluorine-containing gas such that the ratio of the number of fluorine atoms to the number of carbon atoms is 3 or less, and it is understood to facilitate deep etching and taper angle control in dry etching.

Example 3

As a heat-reactive resist material for dry etching, $CrO_{0.5}$/$SiO_2$ ($SiO_2$=10 mol %) was used. As a substrate, plate-shaped quartz with 50 mm Φ was used.

First, a heat-reactive resist layer containing the heat-reactive resist material for dry etching was deposited on the substrate in a thickness of 25 nm by the sputtering method. As a target, a mixed target of Cr and $SiO_2$ was used. Conditions of deposition are shown in following Table 3.

Next, the deposited heat-reactive resist for dry etching layer was exposed to form thermally reacted areas in the heat-reactive resist layer. Exposure conditions are shown below. In addition, in this Example, to examine exposure accuracy, exposure was made so that the heat-reactive resist layer was a continuous groove-shaped pattern, and as the heat-reactive resist pattern, by modulating the intensity of a laser during exposure, it is possible to form various patterns such as the shape of a circle and the shape of an oval according to application of the mold to manufacture.
  Wavelength of semiconductor laser for exposure: 405 nm
  Lens aperture: 0.85
  Exposure laser power: 1 mV~10 mV
  Feed pitch: 120 nm~350 nm Next, the exposed heat-reactive resist layer was developed in a wet step. Using a developing solution, the thermally reacted areas of the heat-reactive resist layer were dissolved, removed and developed at room temperature. Conditions of development are shown in following Table 3. When a surface shape of the developed heat-reactive resist material was observed by SEM, a pattern with an opening width A shown in following Table 4 was formed.

Next, using the heat-reactive resist layer with the pattern formed as a mask, dry etching was performed on the substrate. Dry etching was carried out on the conditions that the processing gas pressure was 5 Pa, processing power was 200 W and that processing time was 60 minutes, using a side wall protection gas (F/C=2.7) obtained by mixing $CF_4$ and $C_4F_8$ in a ratio of 70 vol %:30 vol % as the fluorine-containing gas. After etching, when a cross-sectional shape was observed by SEM, a fine pattern with an opening width B shown in following Table 4 was formed. Further, when a cross-sectional SEM image of the pattern shape was observed, an etching shape with a taper angle added by the side wall protection effect was formed with the opening width A of the pattern of the heat-reactive resist layer maintained.

Example 4

As a heat-reactive resist material for dry etching, $CrO_{0.8}/SiO_2$ ($SiO_2$=15 mol %) was used. As a substrate, sleeve-shaped quartz with 080 mm was used.

First, a heat-reactive resist layer containing the heat-reactive resist material for dry etching was deposited on the sleeve-shaped substrate in a thickness of 25 nm by the sputtering method. As a target, a mixed target of Cr and $SiO_2$ was used. Conditions of deposition are shown in following Table 3.

Next, the heat-reactive resist material for dry etching layer deposited on the sleeve-shaped substrate was exposed to form thermally reacted areas in the heat-reactive resist layer.

Exposure conditions are shown below.
Wavelength of semiconductor laser for exposure: 405 nm
Lens aperture: 0.85
Exposure laser power: 1 mV~25 mV
Feed pitch: 120 nm~350 nm
Rotation speed: 210 rpm~1670 rpm Next, the exposed heat-reactive resist layer was developed in a wet step. Using a developing solution, the thermally reacted areas of the heat-reactive resist layer were dissolved, removed and developed at room temperature. Conditions of development are shown in following Table 3. When a surface shape of the developed heat-reactive resist material was observed by SEM, a pattern with an opening width A shown in following Table 4 was formed.

Next, using a UV curable resin, the pattern shape of the developed heat-reactive resist layer was transferred to a film. When a surface shape of the film with the pattern shape transferred was observed by SEM, a pattern with an opening width A shown in following Table 4 was formed. When a cross-sectional SEM image of the pattern shape was observed, an etching shape rectangular in a cross-sectional view was formed with the opening width A of the pattern of the heat-reactive resist layer maintained.

Next, using the heat-reactive resist layer with the pattern formed as a mask, dry etching was performed on the substrate. Dry etching was carried out on the conditions that the processing gas pressure was 5 Pa, processing power was 200 W and that processing time was 8 minutes, using $CF_4$ gas (F/C=4) as the fluorine-containing gas. After etching, a surface shape was transferred to a film using a UV curable resin. When a surface shape of the obtained film was observed by SEM, a pattern with an opening width B shown in following Table 4 was formed, and a rectangular etching shape was formed with the opening width A of the heat-reactive resist layer maintained.

Example 5

Using the heat-reactive resist material for dry etching prepared in Example 3, exposure was performed on the following conditions.
Wavelength of semiconductor laser for exposure: 405 nm
Lens aperture: 0.85
Exposure laser power: 1 mV~10 mV
Feed pitch: 100 nm Next, the exposed heat-reactive resist layer was developed in a wet step. Using a developing solution, the thermally reacted areas of the heat-reactive resist layer were dissolved, removed and developed at room temperature. Conditions of development are shown in following Table 3. When a surface shape of the developed heat-reactive resist material was observed by SEM, a pattern with an opening width A shown in following Table 4 was formed.

Next, using the heat-reactive resist layer with the pattern formed as a mask, dry etching was performed on the substrate. Dry etching was carried out on the conditions that the processing gas pressure was 5 Pa, processing power was 200 W and that processing time was 8 minutes, using $CF_4$ gas (F/C=4) as the fluorine-containing gas. After etching, when a cross-sectional shape was observed by SEM, a fine pattern with an opening width B shown in following Table 4 was formed. When a slanting surface SEM image of the pattern shape was observed, a pattern of the opening width B as shown in Table 4 was formed, and a rectangular etching shape was formed with the opening width A of the heat-reactive resist layer maintained.

Example 6

As a heat-reactive resist material for dry etching, $CrO_{0.5}/Ta_2O_5$ ($Ta_2O_5$=10 mol %) was used. As a substrate, plate-shaped quartz with 50 mm Φ was used.

First, a heat-reactive resist layer containing the heat-reactive resist material for dry etching was deposited on the substrate in a thickness of 25 nm by the sputtering method. As a target, a mixed target of Cr and $Ta_2O_5$ was used. Conditions of deposition are shown in following Table 3.

Next, the deposited heat-reactive resist for dry etching layer was exposed to form thermally reacted areas in the heat-reactive resist layer. Exposure conditions are shown below. In addition, in this Example, to examine exposure accuracy, exposure was made so that the heat-reactive resist layer was a continuous groove-shaped pattern, and as the heat-reactive resist pattern, by modulating the intensity of a laser during exposure, it is possible to form various patterns such as the shape of a circle and the shape of an oval according to application of the mold to manufacture.
Wavelength of semiconductor laser for exposure: 405 nm
Lens aperture: 0.85
Exposure laser power: 1 mV~10 mV
Feed pitch: 100 nm~350 nm Next, the exposed heat-reactive resist layer was developed in a wet step. Using a developing solution, the thermally reacted areas of the heat-reactive resist layer were dissolved, removed and developed at room temperature. Conditions of development are shown in following Table 3.

When a surface shape of the developed heat-reactive resist material was observed by SEM, a pattern with an opening width A shown in following Table 4 was formed.

Next, using the heat-reactive resist layer with the pattern formed as a mask, dry etching was performed on the substrate. Dry etching was carried out on the conditions that the processing gas pressure was 5 Pa, processing power was 200 W and that processing time was 60 minutes, using a side wall protection gas (F/C=2.7) obtained by mixing $CF_4$ and $C_4F_8$ in a ratio of 70 vol %:30 vol % as the fluorine-containing gas. After etching, when a cross-sectional shape was observed by SEM, a fine pattern with an opening width B shown in following Table 4 was formed. An etching shape with a taper angle added by the side wall protection effect was formed with the opening width A of the pattern of the heat-reactive resist layer maintained.

Example 7

As a heat-reactive resist material for dry etching, $CuO/SiO_2$ ($SiO_2=10$ mol %) and $CrO_{0.5}/SiO_2$ ($SiO_2=10$ mol %) were used. As a substrate, plate-shaped quartz with 50 mm Φ was used.

First, a heat-reactive resist layer containing the heat-reactive resist material for dry etching was deposited on the substrate in a thickness of 25 nm by the sputtering method. As a target, a mixed target of CuO and $SiO_2$ was used for $CuO/SiO_2$, and a mixed target of Cr and $SiO_2$ was used for $CrO_{0.5}/SiO_2$. Conditions of deposition are shown in following Table 3.

Next, the deposited heat-reactive resist for dry etching layer was exposed to form thermally reacted areas in the heat-reactive resist layer. Exposure conditions are shown below. In addition, in this Example, to examine exposure accuracy, exposure was made so that the heat-reactive resist layer was a continuous groove-shaped pattern, and as the heat-reactive resist pattern, by modulating the intensity of a laser during exposure, it is possible to form various patterns such as the shape of a circle and the shape of an oval according to application of the mold to manufacture.

Wavelength of semiconductor laser for exposure: 405 nm
Lens aperture: 0.85
Exposure laser power: 1 mV~25 mV
Feed pitch: 100 nm~10 μm Next, the exposed heat-reactive resist layer was developed in a wet step. Using a developing solution, the thermally reacted areas of the heat-reactive resist layer were dissolved, removed and developed at room temperature. Conditions of development are shown in following Table 3. When a surface shape of the developed heat-reactive resist material was observed by SEM, a pattern with a pattern pitch and an opening width A shown in following Table 5 was formed.

Next, using the heat-reactive resist layer with the pattern formed as a mask, dry etching was performed on the substrate. Dry etching was carried out on the conditions in Table 5 using a side wall protection gas (F/C=2.7) obtained by mixing $CF_4$ and $C_4F_8$ in a ratio of 70 vol %:30 vol % as the fluorine-containing gas.

After etching, when a surface shape and face shape were observed by SEM, formed was a substrate with fine concavities and convexities having an opening width B and dry etching depth shown in Table 5. Further, to confirm existence of fluorocarbons on the side wall of the concave portion, SEM-EDX analysis was performed. As a result, signals caused by fluorine and carbon were observed from the side wall portion, and it was confirmed that the side walls of the concave portions of the substrate with fine concavities and convexities were coated with fluorocarbons.

Comparative Example 1

Deposition was performed on the same conditions as in Example 3 except that $WO_{0.5}/SiO_2$ ($SiO_2=10$ mol %) was used as a heat-reactive resist material. As a target, a mixed target of W and $SiO_2$ was used. Conditions of the deposition are shown in following Table 3.

Next, the deposited heat-reactive resist for dry etching layer was exposed to form thermally reacted areas in the heat-reactive resist layer. Exposure conditions are shown below.

Wavelength of semiconductor laser for exposure: 405 nm
Lens aperture: 0.85
Exposure laser power: 1 mV~10 mV
Feed pitch: 120 nm~350 nm Next, the exposed heat-reactive resist layer was developed. A wet step was used in development. Using a developing solution, the thermally reacted areas of the heat-reactive resist layer were dissolved, removed and developed at room temperature. Conditions of the development are shown in following Table 3. When a surface shape of the developed heat-reactive resist material was observed by SEM (Scanning Electron Microscope), a pattern with an opening width A shown in following Table 4 was formed.

Next, using the heat-reactive resist layer with the pattern formed as a mask, dry etching was performed on the substrate. Dry etching was carried out on the same conditions as in Example 3. After etching, when a cross-sectional shape was observed by SEM, a fine pattern with an opening width B shown in following Table 4 was formed, the opening width was increased significantly as compared with the opening width A of the pattern of the heat-reactive resist layer, and the heat-reactive resist layer was subjected to dry etching.

TABLE 3

| | Resist material | Target | Rate of $O_2$ (vol %) | Pressure (Pa) | Developing solution | Development time (min) |
|---|---|---|---|---|---|---|
| Example 3 | $CrO_{0.5}/SiO_2$ ($SiO_2$ = 10 mol %) | Cr(3inΦ)/$SiO_2$ | 5 | 0.1 | Alkali developing solution | 15 |
| Example 4 | $CrO_{0.8}/SiO_2$ ($SiO_2$ = 15 mol %) | Cr(3inΦ)/$SiO_2$ | 7 | 0.1 | Alkali developing solution | 15 |
| Example 5 | $CrO_{0.5}/SiO_2$ ($SiO_2$ = 10 mol %) | Cr(3inΦ)/$SiO_2$ | 5 | 0.1 | Alkali developing solution | 15 |
| Example 6 | $CrO_{0.5}/Ta_2O_5$ ($Ta_2O_5$ = 10 mol %) | Cr(3inΦ)/$Ta_2O_5$ | 5 | 0.1 | Alkali developing solution | 15 |
| Example 7A | $CrO_{0.5}/SiO_2$ ($SiO_2$ = 10 mol %) | Cr(3inΦ)/$SiO_2$ | 5 | 0.1 | Alkali developing solution | 15 |
| Example 7B | $CuO/SiO_2$ ($SiO_2$ = 10 mol %) | Cu(3inΦ)/$SiO_2$ | 5 | 0.1 | Glycine aqueous solution | 5 |
| Comparative Example 1 | $WO_{0.5}/SiO_2$ ($SiO_2$ = 10 mol %) | W(3inΦ)/$SiO_2$ | 10 | 0.1 | Alkali developing solution | 5 |

TABLE 4

| | Resist material | Fluorine-containing gas | Opening width A (nm) | Opening width B (nm) |
|---|---|---|---|---|
| Example 3 | $CrO_{0.5}/SiO_2$ ($SiO_2$ = 10 mol %) | $CF_4$ (70 vol %) + $C_4F_8$ (30 vol %) | 220 | 220 |
| Example 4 | $CrO_{0.8}/SiO_2$ ($SiO2$ = 15 mol %) | $CF_4$ | 160 | 160 |
| Example 5 | $CrO_{0.5}/SiO_2$ ($SiO_2$ = 10 mol %) | $CF_4$ | 50 | 50 |
| Example 6 | $CrO_{0.5}/Ta_2O_5$ ($Ta_2O_5$ = 10 mol %) | $CF_4$ (70 vol %) + $C_4F_8$ (30 vol %) | 200 | 200 |
| Comparative Example 1 | $WO_{0.5}/SiO_2$ ($SiO2$ = 10 mol %) | $CF_4$ (70 vol %) + $C_4F_8$ (30 vol %) | 220 | 300 |

TABLE 5

| | Dry etching condition | | | | Fine concavo-convex structure | | |
|---|---|---|---|---|---|---|---|
| Example 7 | Pressure (Pa) | Power (W) | Time (min) | Pitch (nm) | Opening width A (nm) | Opening width B (nm) | Pattern depth (nm) |
| $CrO_{0.5}/SiO_2$ ($SiO_2$ = 10 mol %) | 5 | 200 | 60 | 300 | 220 | 220 | 150 |
| $CuO/SiO_2$ ($SiO_2$ = 10 mol %) | 10 | 300 | 10 | 300 | 220 | 280 | 150 |

As can be seen from Tables 3 to 5, in the case of using the resist material for dry etching containing $CrO_x$ ($0<X<3$) and the additive containing the material that does not form a compound with $CrO_x$ ($0<X<3$), the opening width A and the opening width B are the same (Examples 3 to 7). From the result, in the case of using the resist material for dry etching containing $CrO_x$ ($0<X<3$) and the additive, it is understood that it is possible to have high resistance to the fluorine-containing gas, obtain the function as a mask sufficiently, and form a groove with a sufficient depth in the film thickness direction (Examples 3 to 7). Particularly, since in the case of using the side wall protection gas as the fluorine-containing gas, it is possible to form a pattern with a taper angle, and in the case of using the etching gas, it is possible to make a rectangular pattern, it is understood that it is possible to control the etching angle with ease.

In contrast thereto, in the case of using $WO_x$ (X=0.5) as a substitute for $CrO_x$ ($0<X<3$) as the heat-reactive resist material for dry etching, the opening width A and opening width B are significantly different, and it is understood that it is not possible to form a groove with a sufficient depth in the film thickness direction (Comparative Example 1). As the reason of the result, it is conceivable that the heat-reactive resist material for dry etching was etched by the fluorine-containing gas, and did not obtain a sufficient function as the mask.

Industrial Applicability

The present invention is capable of being applied suitably to manufacturing of substrates with fine concavities and convexities, and is capable of being used suitably in manufacturing of substrates with fine concavities and convexities applicable to substrates for antireflection, light condensing, light extraction, water repellency, hydrophilicity, media and film growth, for example.

The present application is based on Japanese Patent Application No. 2012-014820 filed on Jan. 27, 2012, Japanese Patent Application No. 2012-128275 filed on Jun. 5, 2012, and Japanese Patent Application No. 2012-185252 filed on Aug. 24, 2012. Entire contents thereof and entire content of International Publication No. 2010/044400 Pamphlet cited in the present Description are expressly incorporated by reference herein.

The invention claimed is:

1. A method of manufacturing a fine concavo-convex structure product provided with an etching layer and a resist layer including a heat-reactive resist material for dry etching provided on the etching layer, said method comprising:
   selecting said heat-reactive resist material, for dry etching, out of at least one species from a group consisting of Cr, Fe, Co, Al, Ga, In, Hf, Pb, oxides thereof and nitrides thereof;
   forming openings in said resist layer by exposure;
   forming concave portions corresponding to said openings in said etching layer by dry etching, thereby forming a fine pattern of a concavo-convex structure,
   wherein a pattern pitch P of said fine pattern of said concavo-convex structure ranges from 1nm to 10 μm,
   wherein a cross-sectional shape of said concave portions is a trapezoid or a triangle, and
   wherein when said dry etching is carried out, side surfaces of said concave portions of said concavo-convex structure of said etching layer are coated with fluorocarbons while forming a taper surface on said side surfaces due to a side wall protection effect produced by said fluorocarbons while maintaining a predetermined opening width of said openings in said resist layer.

2. The method of manufacturing a fine concavo-convex structure product according to claim 1, wherein in any one of a plurality of concave portions forming the concavo-convex structure, when boundaries between an opening portion of a concave portion and a surface on an upper side of the etching layer are two lines and the two lines do not cross each other, one point on one of the two lines and one point on the other one having the shortest distance therebetween are made two highest points, and the pattern cross-sectional shape is a shape drawn by connecting, with straight lines, the two highest points and one point when the lowest point of the concave portion is the one point, or two points having the longest distance when lowest points of the concave portion are two or more in a cross section obtained by cutting the fine concavo-convex structure product along a thickness direction of the etching layer so as to include these two highest points.

3. The method of manufacturing a fine concavo-convex structure product according to claim 1, wherein in any one of a plurality of concave portions forming the concavo-convex structure, when a boundary between an opening portion of a concave portion and a surface on the upper side of the etching layer is one line and both ends are connected and closed, two points on the one line having the longest distance therebetween are made two highest points, and the pattern cross-sectional shape is a shape drawn by connecting, with straight lines, the two highest points and one point when the lowest point of the concave portion is the one point, or two points having the longest distance when lowest points of the concave portion are two or more in a cross section obtained by cutting the fine concavo-convex structure product along a thickness direction of the etching layer so as to include these two highest points.

4. The method of manufacturing a fine concavo-convex structure product according to claim 1, wherein in any one of a plurality of convex portions forming the concavo-convex structure, the pattern cross-sectional shape is a shape drawn by connecting, with straight lines, one highest point or two highest points and two lowest points having the longest distance among lowest points of a convex portion, in a cross section obtained by cutting the fine concavo-convex structure product along a thickness direction of the etching layer, so as to include the one highest point when the highest point of the convex portion is the one point, or include the two highest points that are two points on one line and that have the longest distance when the highest points of the convex portion are two or more in the case where a boundary between a surface on the upper side and a side wall surface of the etching layer is the one line and both ends are connected and closed.

5. The method of manufacturing a fine concavo-convex structure product according to claim 1,
wherein the pattern cross-sectional shape meets Equation (1) or Equation (2):

$$0 < T_0 = B_1 < T_1 \leq 10 \ \mu m \qquad \text{Eq. (1)}$$

$$0 \leq B_1 < T_0 = T_1 < 10 \ \mu m \qquad \text{Eq. (2)}$$

$T_0$: Width of the opening portion of the resist layer before dry etching
$T_1$: Width of the concave portion on the highest portion side formed in the etching layer after dry etching
$B_1$: Width of the concave portion on the deepest portion side formed in the etching layer after dry etching.

6. The method of manufacturing a fine concavo-convex structure product according to claim 1, wherein the pattern pitch P ranges from 1 nm to 1 μm.

7. The method of manufacturing a fine concavo-convex structure product according to claim 5, wherein the fine pattern meets Equation (1).

8. The method of manufacturing a fine concavo-convex structure product according to claim 5, wherein the fine pattern meets Equation (2).

\* \* \* \* \*